(12) United States Patent
Sugita et al.

(10) Patent No.: US 10,861,729 B2
(45) Date of Patent: Dec. 8, 2020

(54) TRANSFER METHOD AND TRANSFER SYSTEM

(71) Applicant: Tokyo Electron Limited, Tokyo (JP)

(72) Inventors: Kippei Sugita, Miyagi (JP); Daisuke Kawano, Miyagi (JP); Yoshihiro Yanagi, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/710,985

(22) Filed: Dec. 11, 2019

(65) Prior Publication Data

US 2020/0194295 A1 Jun. 18, 2020

(30) Foreign Application Priority Data

Dec. 14, 2018 (JP) ................................. 2018-234265

(51) Int. Cl.
*H01L 21/677* (2006.01)
*H01J 37/32* (2006.01)
*H01L 21/683* (2006.01)
*H01L 21/67* (2006.01)

(52) U.S. Cl.
CPC .. *H01L 21/67742* (2013.01); *H01J 37/32642* (2013.01); *H01L 21/67259* (2013.01); *H01L 21/67265* (2013.01); *H01L 21/6833* (2013.01)

(58) Field of Classification Search
CPC .......... H01L 21/67259; H01L 21/67265; H01J 37/32642
See application file for complete search history.

(56) References Cited

U.S. PATENT DOCUMENTS

| 2001/0012972 A1* | 8/2001 | Matsumoto ........ G05B 19/4166 700/160 |
| 2012/0247671 A1* | 10/2012 | Sugawara ......... H01L 21/67346 156/345.31 |
| 2018/0315640 A1* | 11/2018 | Ueda ................. H01J 37/32642 |
| 2019/0164791 A1* | 5/2019 | Sugita ............... H01L 21/67259 |
| 2019/0277665 A1* | 9/2019 | Sugita ..................... H01L 21/68 |
| 2019/0279848 A1* | 9/2019 | Sugita .................. G01D 5/2417 |

FOREIGN PATENT DOCUMENTS

JP 2006-196691 A 7/2006

* cited by examiner

*Primary Examiner* — Ronald D Hartman, Jr.
(74) *Attorney, Agent, or Firm* — Studebaker & Brackett PC

(57) ABSTRACT

A transfer method according to an exemplary embodiment includes: transferring a focus ring onto a stage by a transfer unit; transferring a measuring instrument into an inner region of the transferred focus ring and onto an electrostatic chuck; acquiring a measurement value group by the transferred measuring instrument; and adjusting a transfer position of the focus ring by the transfer unit such that the central position of the electrostatic chuck and the central position of the focus ring coincide with each other based on the measurement value group.

7 Claims, 16 Drawing Sheets

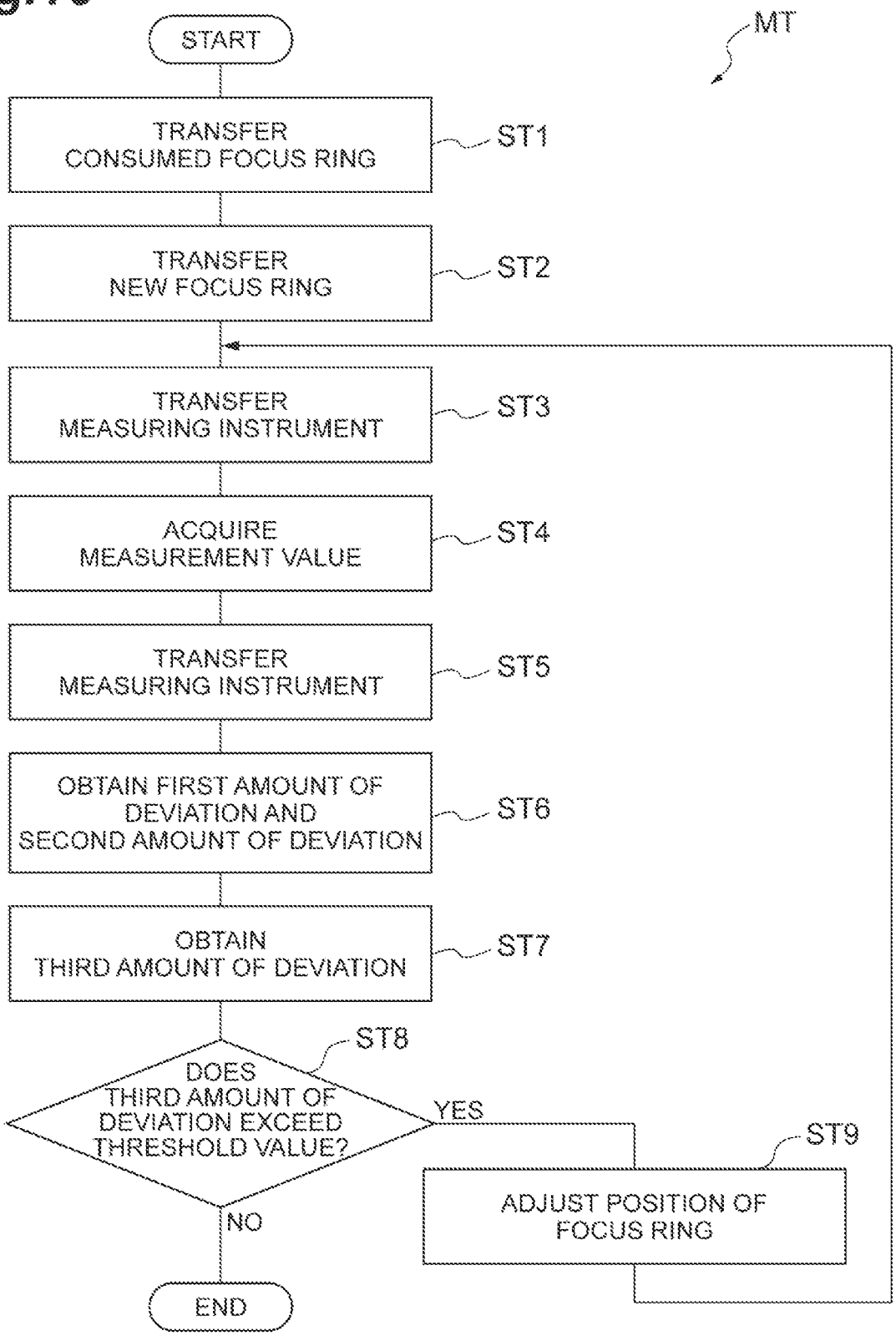

TRANSFER METHOD AND TRANSFER SYSTEM

CROSS-REFERENCE TO RELATED APPLICATIONS

This application is based on and claims the benefit of priority from Japanese Patent Application No. 2018-234265 filed on Dec. 14, 2018 the entire contents of which is incorporated herein by reference.

TECHNICAL FIELD

Exemplary embodiments of the present disclosure relate to a transfer method and a transfer system.

BACKGROUND

Japanese Unexamined Patent Publication No. 2006-196691 discloses a semiconductor manufacturing apparatus. The apparatus includes a substrate processing chamber, a focus ring standby chamber, and a transfer mechanism. An electrode is disposed inside the substrate processing chamber. A substrate is placed on the electrode. The focus ring standby chamber accommodates a plurality of focus rings. The transfer mechanism transfers the focus ring accommodated in the focus ring standby chamber to the substrate processing chamber without opening the substrate processing chamber to the atmosphere. The focus ring is disposed so as to surround the periphery of the substrate placed on the electrode.

SUMMARY

In one exemplary embodiment, a transfer method is provided. The transfer method is a transfer method in a transfer system of a focus ring, and the transfer system includes a processing system and a measuring instrument. The processing system includes a processing apparatus and a transfer unit. The processing apparatus has a chamber body and a stage including an electrostatic chuck provided in the chamber provided by the chamber body. The transfer unit transfers a workpiece into the inner region surrounded by the focus ring disposed on the stage and onto the electrostatic chuck based on transfer position data. The measuring instrument includes a sensor that acquires a measurement value group for obtaining a first amount of deviation which is an amount of deviation of a central position of the focus ring with respect to the central position of the focus ring and a second amount of deviation which is an amount of deviation of the central position of the measuring instrument with respect to a central position of the electrostatic chuck, in a state where the measuring instrument is positioned in the inner region and on the electrostatic chuck. The method includes: a step of transferring the focus ring onto the stage by the transfer unit; a step of transferring the measuring instrument by the transfer unit into the inner region of the transferred focus ring and onto the electrostatic chuck; a step of acquiring the measurement value group by the transferred measuring instrument; a step of obtaining the first amount of deviation and the second amount of deviation based on the measurement value group; a step of obtaining a third amount of deviation which is an amount of deviation of the central position of the focus ring with respect to the central position of the electrostatic chuck based on the first amount of deviation and the second amount of deviation; and a step of adjusting a transfer position of the focus ring by the transfer unit such that the central position of the electrostatic chuck and the central position of the focus ring coincide with each other based on the third amount of deviation.

BRIEF DESCRIPTION OF THE DRAWINGS

FIG. 16 is a flowchart illustrating an example of a method for transferring the focus ring.

DETAILED DESCRIPTION

Figure 1:
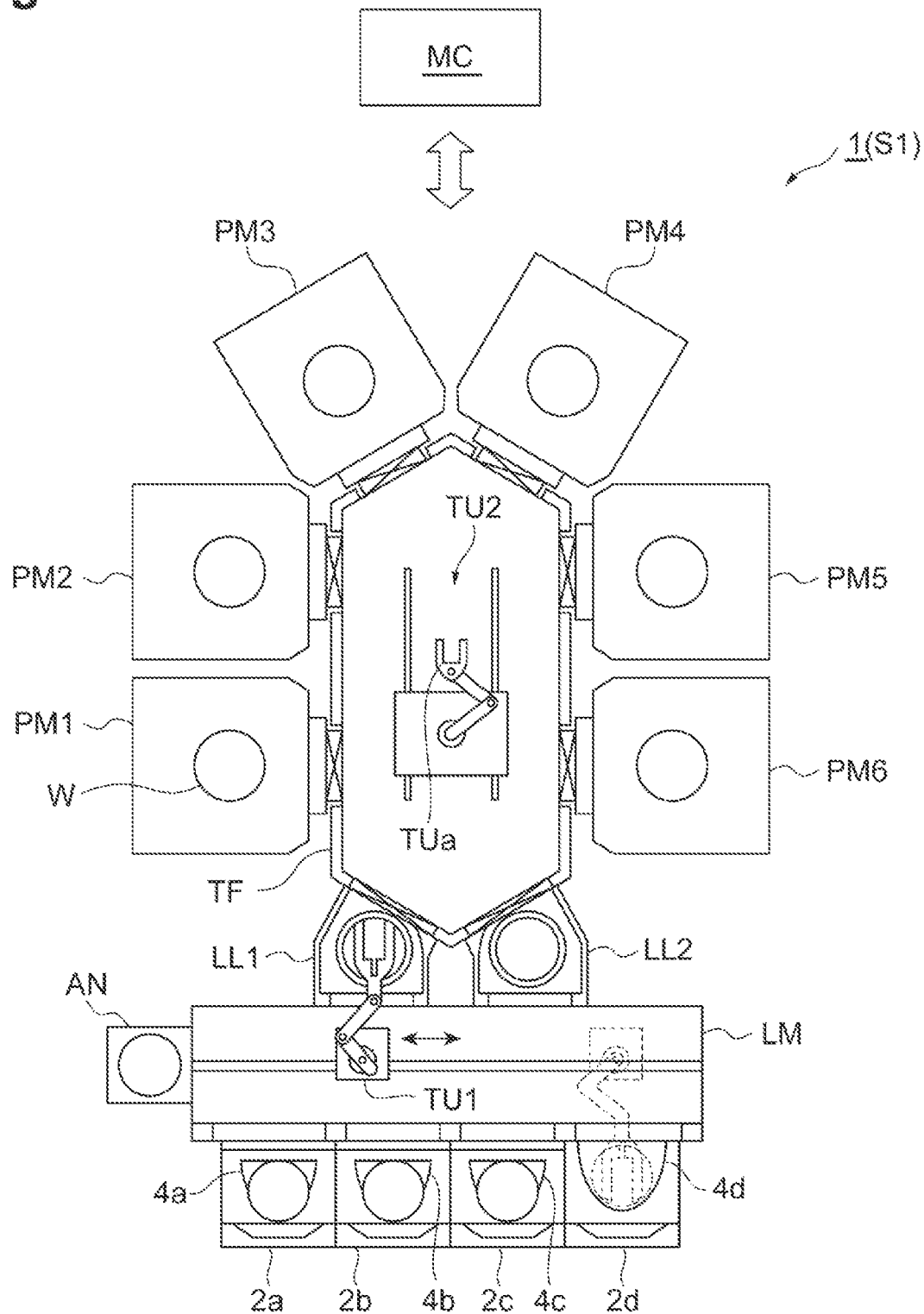
FIG. 1 is a view illustrating an exemplary processing system.

Hereinafter, various embodiments will be described in detail with reference to the drawings.

In one exemplary embodiment, a transfer method is provided. The transfer method is a transfer method in a transfer system of a focus ring, and the transfer system includes a processing system and a measuring instrument. The processing system includes a processing apparatus and a transfer unit. The processing apparatus has a chamber body and a stage including an electrostatic chuck provided in the chamber provided by the chamber body. The transfer unit transfers a workpiece into the inner region surrounded by the focus ring disposed on the stage and onto the electrostatic chuck based on transfer position data. The measuring instrument includes a sensor that acquires a measurement value group for obtaining the first amount of deviation and the second amount of deviation in a state where the measuring instrument is positioned in the inner region and on the electrostatic chuck. The first amount of deviation is an amount of deviation of a central position of the measuring instrument with respect to a central position of the focus ring. The second amount of deviation is an amount of deviation of a central position of the measuring instrument with respect to a central position of the electrostatic chuck.

The method includes a step of transferring the focus ring onto the stage by a transfer unit. The method includes a step of transferring the measuring instrument by the transfer unit into the inner region of the transferred focus ring and onto the electrostatic chuck. The method includes a step of acquiring a measurement value group by the transferred measuring instrument. The method includes a step of obtaining a first amount of deviation and a second amount of deviation based on the measurement value group. The method includes a step of obtaining a third amount of deviation which is an amount of deviation of a central position of the focus ring with respect to a central position of the electrostatic chuck based on the first amount of deviation and the second amount of deviation. The method includes a step of adjusting the transfer position of the focus ring by the transfer unit such that the central position of the electrostatic chuck and the central position of the focus ring coincide with each other based on the third amount of deviation.

In the transfer method of the above-described embodiment, after the focus ring is transferred onto the stage, the measuring instrument is transferred to the inner region of the focus ring. The measuring instrument acquires the measurement value group for obtaining the first amount of deviation and the second amount of deviation in the method, the third amount of deviation which is an amount of deviation of the central position of the focus ring with respect to the central position of the electrostatic chuck is obtained from the first amount of deviation and the second amount of deviation which are obtained based on the measurement value group. The transfer position of the focus ring is adjusted such that the central position of the electrostatic chuck and the central position of the focus ring coincide with each other based on the third amount of deviation. In this manner, after the focus ring is transferred onto the stage, the focus ring can be transferred with high accuracy by adjusting the transfer position of the focus ring based on the third amount of deviation.

In one exemplary embodiment, the transfer unit may be disposed in a space airtightly connected to the chamber body. In this configuration, a focus ring FR can be transferred in the space airtightly connected to the chamber body. In this case, the focus ring can be transferred and the position of the focus ring can be adjusted without opening the chamber body to the atmosphere.

In one exemplary embodiment, the method may further include a step of determining whether or not the third amount of deviation exceeds a threshold value. In this case, in the step of adjusting, the transfer position of the focus ring, the position of the focus ring may be adjusted when it is determined that the third amount of deviation exceeds the threshold value.

In one exemplary embodiment, the method may further include a step of confirming whether or not the third amount of deviation exceeds the threshold value in the focus ring of which the transfer position has been adjusted after the step of adjusting the transfer position of the focus ring.

In another exemplary embodiment, there is provided a system that transfers a focus ring. The system includes a processing system and a measuring instrument. The processing system includes a processing apparatus and a transfer unit. The processing apparatus has a chamber body and a stage including an electrostatic chuck provided in the chamber provided by the chamber body. The transfer unit transfers the focus ring onto the stage, and transfers the measuring instrument into an inner region surrounded by the focus ring and onto the electrostatic chuck. The measuring instrument obtains a third amount of deviation based on the first amount of deviation and the second amount of deviation in a state where the measuring instrument is positioned in the inner region and on the electrostatic chuck. The first amount of deviation is an amount of deviation of a central position of the measuring instrument with respect to a central position of the focus ring. The second amount of deviation is an amount of deviation of a central position of the measuring instrument with respect to a central position of the electrostatic chuck. The third amount of deviation is an amount of deviation of the central position of the focus ring with respect to the central position of the electrostatic chuck. The transfer unit adjusts a transfer position of the focus ring such that the central position of the electrostatic chuck and the central position of the focus ring coincide with each other based on the third amount of deviation.

Hereinafter, various embodiments will be described in detail with reference to the drawings. In the drawing, the same or equivalent portions are denoted by the same reference symbols.

A transfer system S1 of a focus ring FR in one exemplary embodiment executes transfer of the focus ring FR, for example, to replace the focus ring FR that has been consumed due to use with a new focus ring FR. The transfer system S1 includes a processing system 1 and a measuring instrument 100. First, the processing system having a processing apparatus for processing a workpiece, and a transfer unit for transferring a workpiece to the processing apparatus will be described. FIG. 1 is a view illustrating an exemplary processing system. The processing system 1 includes stands 2a to 2d, containers 4a to 4d, a loader module LM, an aligner AN, load lock modules LL1 and LL2, process modules PM1 to PM6, a transfer module TF, and a controller MC. The number of the stands 2a to 2d, the number of the containers 4a to 4d, the number of the load lock modules LL1 and LL2, and the number of the process modules PM1 to PM6 are not limited and can be any number of one or more.

The stands 2a to 2d are arranged along one edge of the loader module LM. The containers 4a to 4d are respectively mounted on the stands 2a to 2d. For example, each of the containers 4a to 4d is a container referred to as a front opening unified pod (FOUP). Each of the containers 4a to 4d is configured to accommodate a workpiece W therein. The workpiece W has a substantial disk shape such as a wafer.

The loader module LM has a chamber wall which defines a transfer space in an atmospheric pressure state therein. A transfer unit TU1 is provided in the transfer space. For example, the transfer unit TU1 is an articulated robot which is controlled by the controller MC. The transfer unit TU1 is configured to transfer the workpiece W between the containers 4a to 4d and the aligner AN, between the aligner AN and the load lock modules LL1 and LL2, and between the load lock modules LL1 and LL2 and the containers 4a to 4d.

Figure 2:
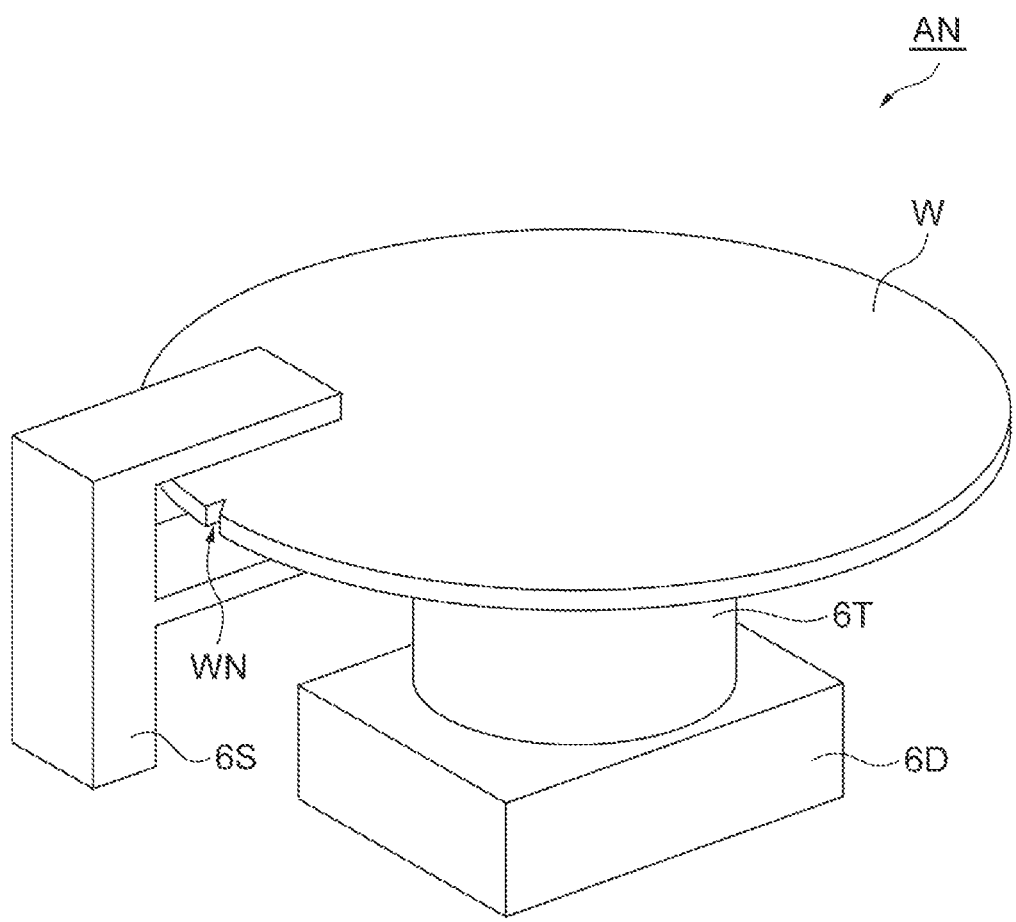
FIG. 2 is a perspective view illustrating an exemplary aligner.

The aligner AN is connected to the loader module LM. The aligner AN is configured to adjust the position (to calibrate the position) of the workpiece W. FIG. 2 is a perspective view illustrating an exemplary aligner. The aligner AN has a support stand 6T, a driving unit 6D, and a sensor 6S. The support stand 6T is a stand capable of rotating around an axis that extends in a vertical direction and is configured to support the workpiece W thereon. The support stand 6T is rotated by the driving unit 6D. The driving unit 6D is controlled by the controller MC. When the support stand 6T rotates due to power from the driving unit 6D, the workpiece W placed on the support stand 6T also rotates.

The sensor 6S is an optical sensor and detects an edge of the workpiece W while the workpiece W is rotated. From the detection result of the edge, the sensor 6S detects the amount of deviation of an angle position of a notch WN (or different type of marker) of the workpiece W with respect to a reference angle position, and the amount of deviation of a central position of the workpiece W with respect to a reference position. The sensor 6S outputs the amount of deviation of the angle position of the notch WN and the amount of deviation of the central position of the workpiece W to the controller MC. The controller MC calculates the rotation amount of the support stand 6T for correcting the angle position of the notch WN to the reference angle position based on the amount of deviation of the angle position of the notch WN. The controller MC controls the driving unit 6D such that the support stand 6T is rotated by the rotation amount. Accordingly, the angle position of the notch WN can be corrected to the reference angle position. The controller MC controls the position of an end effector of the transfer unit TU1 when receiving the workpiece W from the aligner AN, based on the amount of deviation of the central position of the workpiece W. Accordingly, the central position of the workpiece W coincides with a predetermined position on the end effector of the transfer unit TU1.

Referring to FIG. 1 again, each of the load lock module LL1 and the load lock module LL2 is provided between the loader module LM and the transfer module TF. Each of the load lock module LL1 and the load lock module LL2 provides a preliminary depressurization chamber.

The transfer module TF is air-tightly connected to the load lock module LL1 and the load lock module LL2 via gate valves. The transfer module TF provides a depressurization chamber capable of being depressurized. A transfer unit TU2 is provided in the depressurization chamber. For example, the transfer unit TU2 is an articulated robot having a transfer arm TUa and is controlled by the controller MC. The transfer unit TU2 is configured to transfer the workpiece W between the load lock modules LL1 and LL2 and the process modules PM1 to PM6, and between any two process modules among the process modules PM1 to PM6.

The process modules PM1 to PM6 are airtightly connected to the transfer module TF via gate valves. Each of the process modules PM1 to PM6 is a processing apparatus configured to perform dedicated processing such as plasma processing with respect to the workpiece W.

A series of operations at the time of processing the workpiece W in the processing system 1 is exemplified as follows. The transfer unit TU1 of the loader module LM takes out the workpiece W from any of the containers 4a to 4d and transfers the workpiece W to the aligner AN. Subsequently, the transfer unit TU1 takes out the workpiece W of which the position has been adjusted from the aligner AN and transfers the workpiece W to one load lock module out of the load lock module LL1 and the load lock module 112. Subsequently, in the one load lock module, the pressure in the preliminary depressurization chamber is depressurized to a predetermined pressure. Subsequently, the transfer unit TU2 of the transfer module TF takes out the workpiece W from the one load lock module and transfers the workpiece W to any of the process modules PM1 to PM6. The workpiece W is processed by one or more process modules among the process modules PM1 to PM6. The transfer unit TU2 transfers the processed workpiece W from the process module to one load lock module out of the load lock module LL1 and the load lock module LL2. Subsequently, the transfer unit TU1 transfers the workpiece W from the one load lock module to any of the containers 4a to 4d.

As described above, the processing system 1 includes the controller MC. The controller MC can be a computer including a processor, a storage device such as a memory, a display device, an input/output device, a communication device, and the like. A series of the above-described operations of the processing system 1 is realized by the controller MC controlling each portion of the processing system 1 in accordance with a program stored in the storage device.

Figure 3:
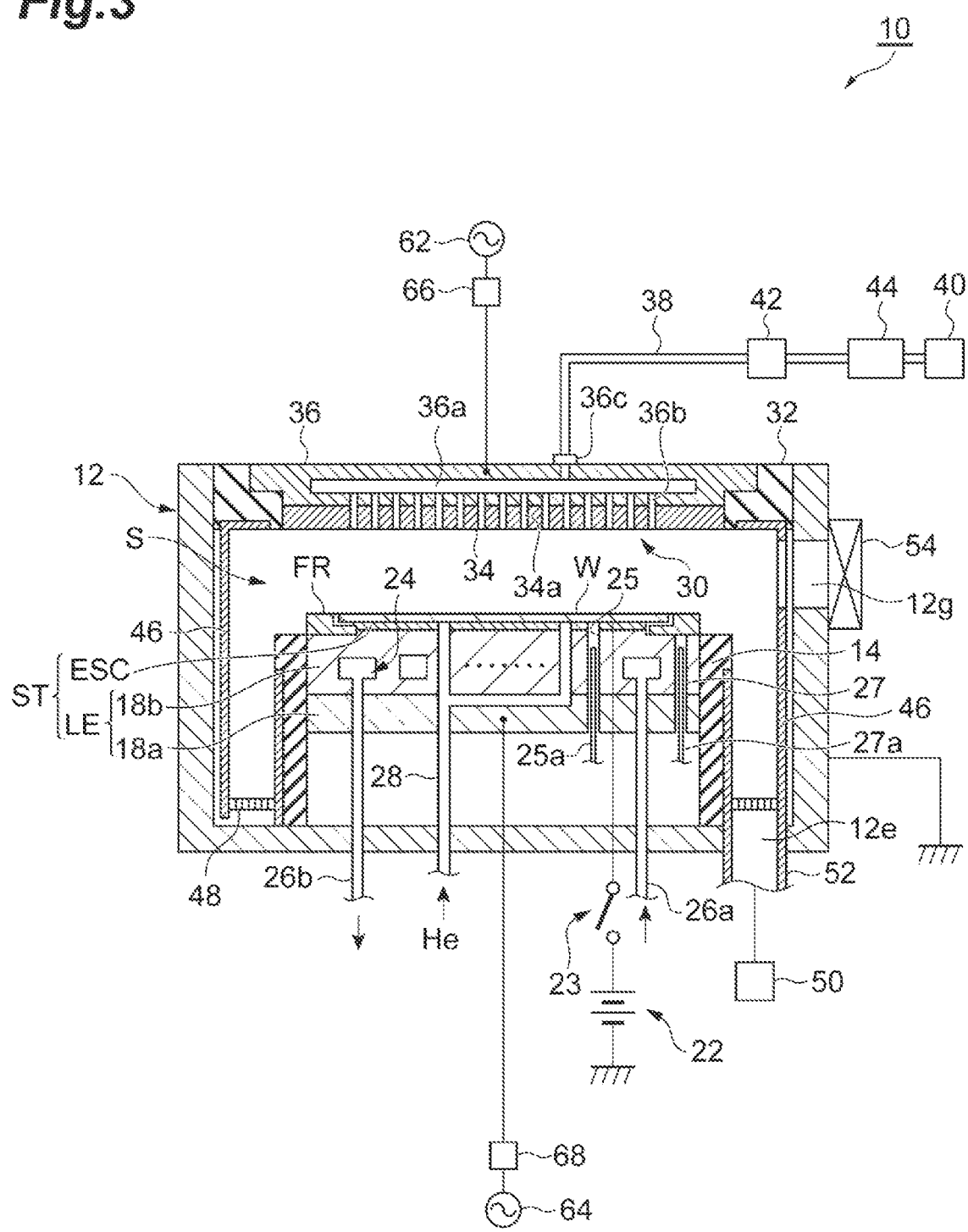
FIG. 3 is a view illustrating an example of a plasma processing apparatus.

FIG. 3 is a view illustrating an example of a plasma processing apparatus which can be employed as any of the process modules PM1 to PM6. A plasma processing apparatus 10 illustrated in FIG. 3 is a capacitive coupling-type plasma etching apparatus. The plasma processing apparatus 10 includes a substantially cylindrical chamber body 12. For example, the chamber body 12 is formed of aluminum, and an inner wall surface thereof can be subjected to anodic oxidation. The chamber body 12 is protected and grounded.

A substantially cylindrical support portion 14 is provided on a bottom portion of the chamber body 12. For example, the support portion 14 is formed of an insulating material. The support portion 14 is provided inside the chamber body 12 and extends upward from the bottom portion of the chamber body 12. In addition, a stage ST is provided inside a chamber S provided by the chamber body 12. The stage ST is supported by the support portion 14.

The stage ST has a lower electrode LE and an electrostatic chuck ESC. The lower electrode LE includes a first plate 18a and a second plate 18b. For example, the first plate 18a and the second plate 18b are formed of metal such as aluminum and have substantial disk shapes. The second plate 18b is provided on the first plate 18a and is electrically connected to the first plate 18a.

The electrostatic chuck ESC is provided on the second plate 18b. The electrostatic chuck ESC has a structure in which an electrode (conductive film) is disposed between a pair of insulating layers or insulating sheets and has a substantial disk shape. A DC power source 22 is electrically connected to the electrode of the electrostatic chuck ESC via a switch 23. The electrostatic chuck ESC attracts the workpiece W by an electrostatic force such as a Coulomb force generated by a DC voltage from the DC power source 22. Accordingly, the electrostatic chuck ESC can hold the workpiece W.

The focus ring FR is provided on a circumferential edge portion of the second plate 18b. The focus ring FR is provided to surround the edge of the workpiece W and the electrostatic chuck ESC. The focus ring FR has a first portion P1 and a second portion P2 (refer to FIG. 7). The first portion P1 and the second portion P2 have annular plate shapes. The second portion P2 is a portion outside the first portion P1. The second portion P2 has a greater thickness in the height direction than the first portion P1. An inner edge P2i of the second portion P2 has a diameter greater than the diameter of an inner edge P1i of the first portion P1. The workpiece W is placed on the electrostatic chuck ESC such that an edge region thereof is positioned on the first portion P1 of the focus ring FR. The focus ring FR can be formed of any of various types of materials such as silicon, silicon carbide, and silicon oxide.

A refrigerant flow channel 24 is provided in the second plate 18b. The refrigerant flow channel 24 configures a temperature control mechanism. A refrigerant is supplied to the refrigerant flow channel 24 via a pipe 26a from a chiller unit provided outside the chamber body 12. The refrigerant supplied to the refrigerant flow channel 24 returns to the chiller unit via a pipe 26b. In this manner, the refrigerant circulates between the refrigerant flow channel 24 and the chiller unit. The temperature of the workpiece W supported by the electrostatic chuck ESC is controlled by controlling the temperature of the refrigerant.

A plurality (for example, three) of through holes 25 penetrating the stage ST are formed in the stage ST. The plurality of through holes 25 are formed inside the electrostatic chuck ESC in a plan view. In each of the through holes 25, lift pins 25a are inserted. FIG. 3 depicts one through hole 25 in which one lift pin 25a is inserted. The lift pin 25a is provided in the through hole 25 so as to be movable up and down. As the lift pins 25a are moved up, the workpiece W supported on the electrostatic chuck ESC is moved up.

The stage ST is formed with a plurality of (for example, three) through holes 27 penetrating the stage ST (lower electrode LE) at a position outside the electrostatic chuck ESC in a plan view. In each of the through holes 27, lift pins 27a are inserted. FIG. 3 depicts one through hole 27 in which one lift pin 27a is inserted. The lift pin 27a is provided in the through hole 27 so as to be movable up and down. The upward movement of the lift pin 27a moves up the focus ring FR supported on the second plate 18b.

In addition, a gas supply line 28 is provided in the plasma processing apparatus 10. The gas supply line 28 supplies heat transfer gas, for example, He gas, from a heat transfer gas supply mechanism to a space between the top surface of the electrostatic chuck ESC and the back surface of the workpiece W.

In addition, the plasma processing apparatus 10 includes an upper electrode 30. The upper electrode 30 is disposed above the stage ST to face the stage ST. The upper electrode 30 is supported by an upper portion of the chamber body 12 via an insulation shielding member 32. The upper electrode 30 can include a top plate 34 and a support body 36. The top plate 34 faces the chamber S. A plurality of gas discharge holes 34a are provided in the top plate 34. The top plate 34 can be formed of silicon or quartz. Otherwise, the top plate 34 can be configured by forming a plasma resistant film such as yttrium oxide on the outer surface of an aluminum-made base material.

The support body 36 detachably supports the top plate 34. For example, the support body 36 can be formed of a conductive material such as aluminum. The support body 36 may have a water-cooling structure. A gas diffusion chamber 36a is provided inside the support body 36. A plurality of gas flow holes 36b communicating with the gas discharge holes 34a extend downward from the gas diffusion chamber 36a. In addition, a gas introduction port 36c introducing processing gas to the gas diffusion chamber 36a is formed in the support body 36. A gas supply pipe 38 is connected to the gas introduction port 36c.

A gas source group 40 is connected to the gas supply pipe 38 via a valve group 42 and a flow-rate controller group 44. The gas source group 40 contains a plurality of gas sources for plural types of gases. The valve group 42 includes a plurality of valves. The flow-rate controller group 44 includes a plurality of flow-rate controllers such as massflow controllers. Each of the plurality of gas sources of the gas source group 40 is connected to the gas supply pipe 38 via the corresponding valve of the valve group 42 and the corresponding flow-rate controller of the flow-rate controller group 44.

In addition, in the plasma processing apparatus 10, a deposit shield 46 is detachably provided along an inner wall of the chamber body 12. The deposit shield 46 is also provided on the outer periphery of the support portion 14. The deposit shield 46 prevents by-products (deposits) of etching from adhering to the chamber body 12. The deposit shield 46 can be configured by covering an aluminum material with ceramics such as yttrium oxide.

An exhaust plate 48 is provided on the bottom portion side of the chamber body 12, that is, between the support portion 14 and a side wall of the chamber body 12. For example, the exhaust plate 48 can be configured by covering an aluminum material with ceramics such as yttrium oxide. A plurality of holes penetrating the exhaust plate 48 in the plate-thickness direction is formed in the exhaust plate 48. An exhaust port 12e is provided below the exhaust plate 48, that is, in the chamber body 12. An exhaust unit 50 is connected to the exhaust port 12e via an exhaust pipe 52. The exhaust unit 50 has a pressure adjustment valve and a vacuum pump such as a turbo-molecular pump and can depressurize the space inside the chamber body 12 to a desired vacuum degree. In addition, an opening 12g for transfer-in and transfer-out of the workpiece W is provided in the side wall of the chamber body 12. The opening 12g can be opened and closed by a gate valve 54.

In addition, the plasma processing apparatus 10 further includes a first high frequency power source 62 and a second high frequency power source 64. The first high frequency power source 62 is a power source which generates a first high frequency wave for generating plasma, and generates, for example, a high frequency wave having a frequency ranging from 27 to 100 MHz. The first high frequency power source 62 is connected to the upper electrode 30 via a matching unit 66. The matching unit 66 has a circuit for matching output impedance of the first high frequency power source 62 and input impedance on a load side (upper electrode 30 side) together. The first high frequency power source 62 may be connected to the lower electrode LE via the matching unit 66.

The second high frequency power source 64 is a power source which generates a second high frequency wave for attracting ion to the workpiece W, and generates, for example, a high frequency wave having a frequency within a range of 400 kHz to 13.56 MHz. The second high frequency power source 64 is connected to the lower electrode LE via a matching unit 68. The matching unit 68 has a circuit for matching output impedance of the second high frequency power source 64 and input impedance on the load side (lower electrode LE side) together.

In the plasma processing apparatus 10, a gas from one or more gas sources selected from the plurality of gas sources is supplied to the chamber S. In addition, the pressure of the chamber S is set to a predetermined pressure by the exhaust unit 50. Moreover, a gas inside the chamber S is excited by the first high frequency from the first high frequency power source 62. Accordingly, plasma is generated. The workpiece W is processed by the generated active species. As necessary, ion may be attracted to the workpiece W due to a bias based on the second high frequency wave of the second high frequency power source 64.

Figure 4:
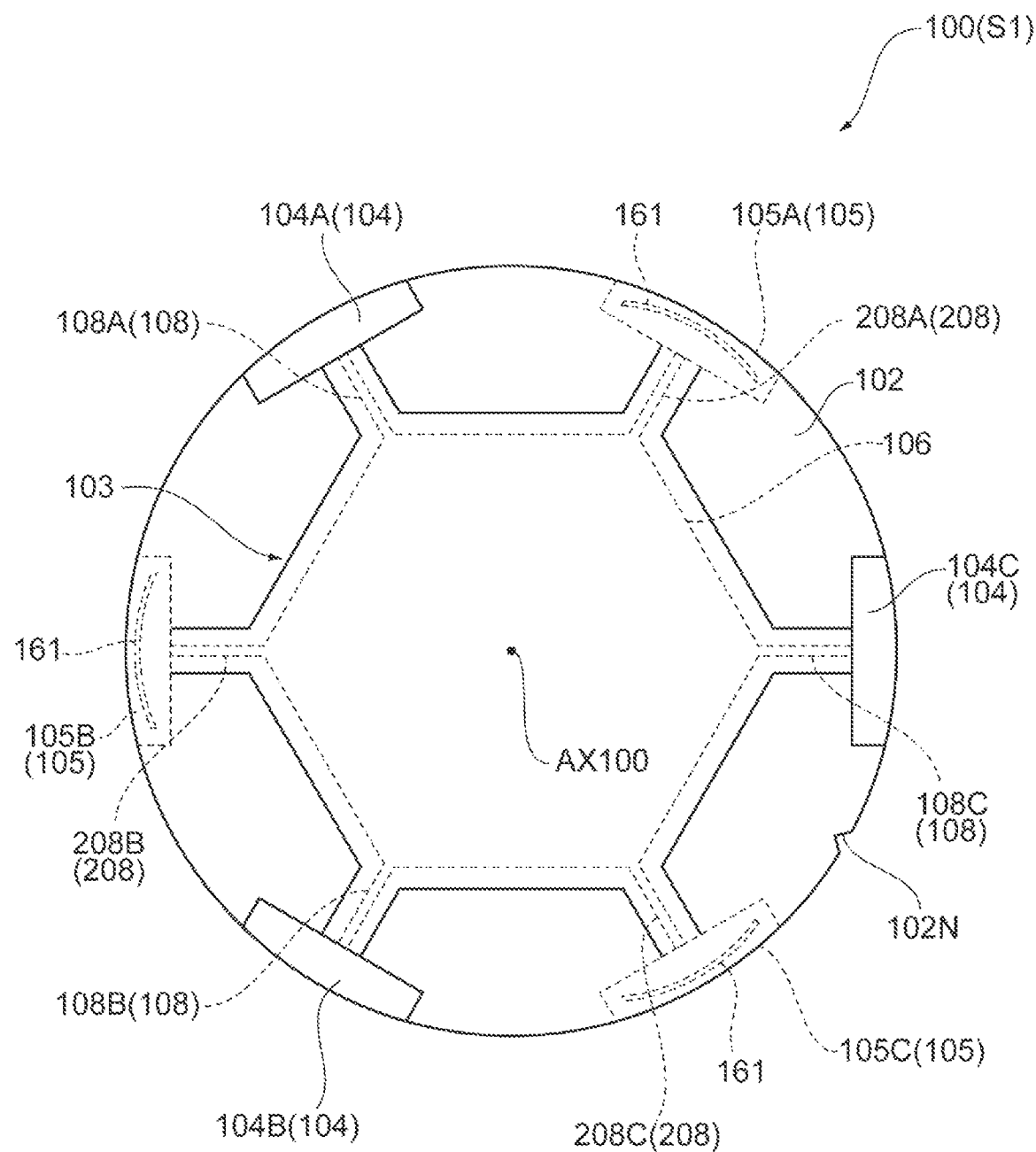
FIG. 4 is a plan view illustrating an exemplary measuring instrument viewed from an upper surface side.
Figure 5:
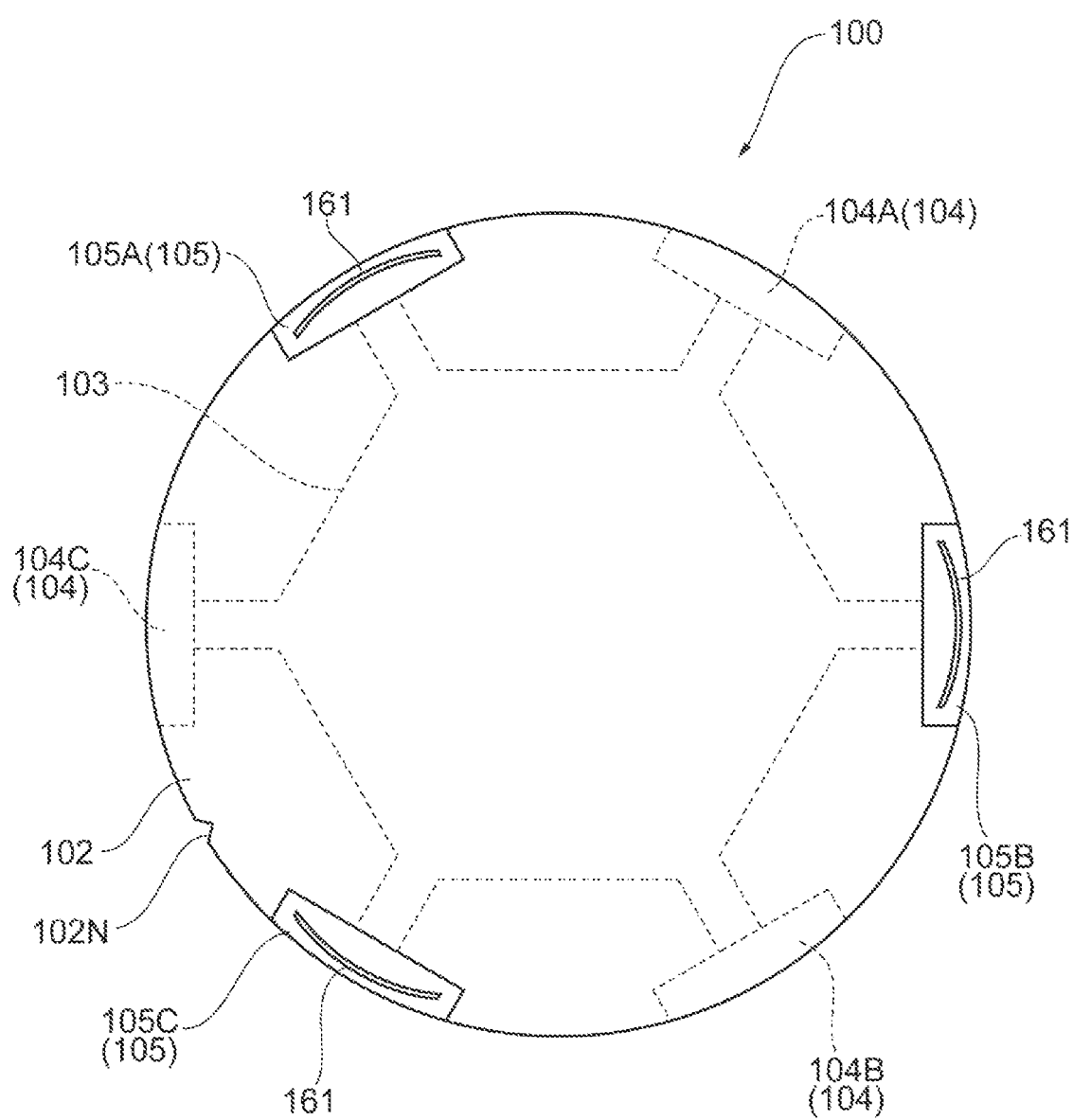
FIG. 5 is a plan view illustrating an exemplary measuring instrument viewed from a bottom surface side.

Hereinafter, the measuring instrument will be described. FIG. 4 illustrates a plan view of the measuring instrument viewed from an upper surface side. FIG. 5 illustrates a plan view of the measuring instrument viewed from a bottom surface side. The measuring instrument 100 illustrated in FIGS. 4 and 5 includes a base substrate 102. For example, the base substrate 102 is formed of silicon and has a shape which is the same as that of the workpiece W, that is, a substantial disk shape. The diameter of the base substrate 102 is a diameter which is the same as that of the workpiece W for example, 300 mm. The shape and the size of the measuring instrument 100 are defined by the shape and the size of the base substrate 102. Therefore, the measuring instrument 100 has the shape which is the same as that of the workpiece W, and has the size which is the same as that of the workpiece W. In addition, a notch 102N (or different type of marker) is formed at the edge of the base substrate 102.

A plurality of first sensors 104A to 104C for measuring electrostatic capacities are provided in the base substrate 102. The plurality of first sensors 104A to 104C are arranged along the edge of the base substrate 102, for example, at equal distances in the whole periphery of the edge. Specifically each of the plurality of first sensors 104A to 104C is provided along the edge of the upper surface side of the base substrate 102. The front side end surface of each of the plurality of first sensors 104A to 104C is along the side surface of the base substrate 102.

In addition, a plurality of second sensors 105A to 105C for measuring electrostatic capacities are provided in the base substrate 102. The plurality of second sensors 105A to 105C are arranged along the edge of the base substrate 102, for example, at equal distances in the whole periphery of the edge. Specifically, each of the plurality of second sensors 105A to 105C is provided along the edge of the bottom surface side of the base substrate 102. Each sensor electrode 161 of the plurality of second sensors 105A to 105C is along the bottom surface of the base substrate 102. The second sensors 105A to 105C and the first sensors 104A to 104C are alternately arranged in the peripheral direction at intervals of 60°.

A circuit board 106 is provided at the center of the upper surface of the base substrate 102. Between the circuit board 106 and the plurality of first sensors 104A to 104C, wiring groups 108A to 108C for electrically connecting the circuit board 106 and the plurality of first sensors 104A to 104C to each other are provided. In addition, between the circuit board 106 and the plurality of second sensors 105A to 105C, wiring groups 208A to 208C for electrically connecting the circuit board 106 and the plurality of second sensors 105A to 105C to each other are provided. The circuit board 106, the wiring groups 108A to 108C, and the wiring groups 208A to 208C are covered with the cover 103.

Figure 6:
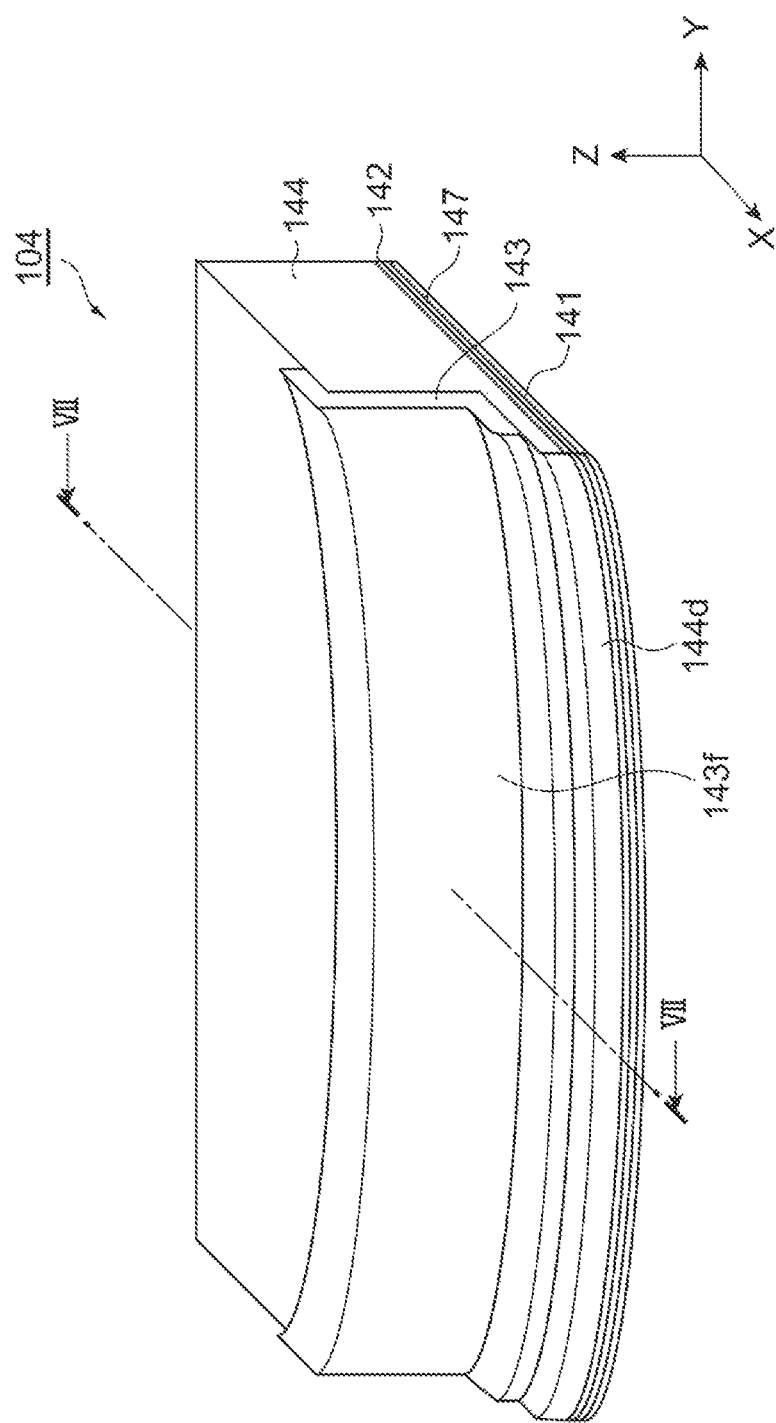
FIG. 6 is a perspective view illustrating an example of a first sensor.
Figure 7:
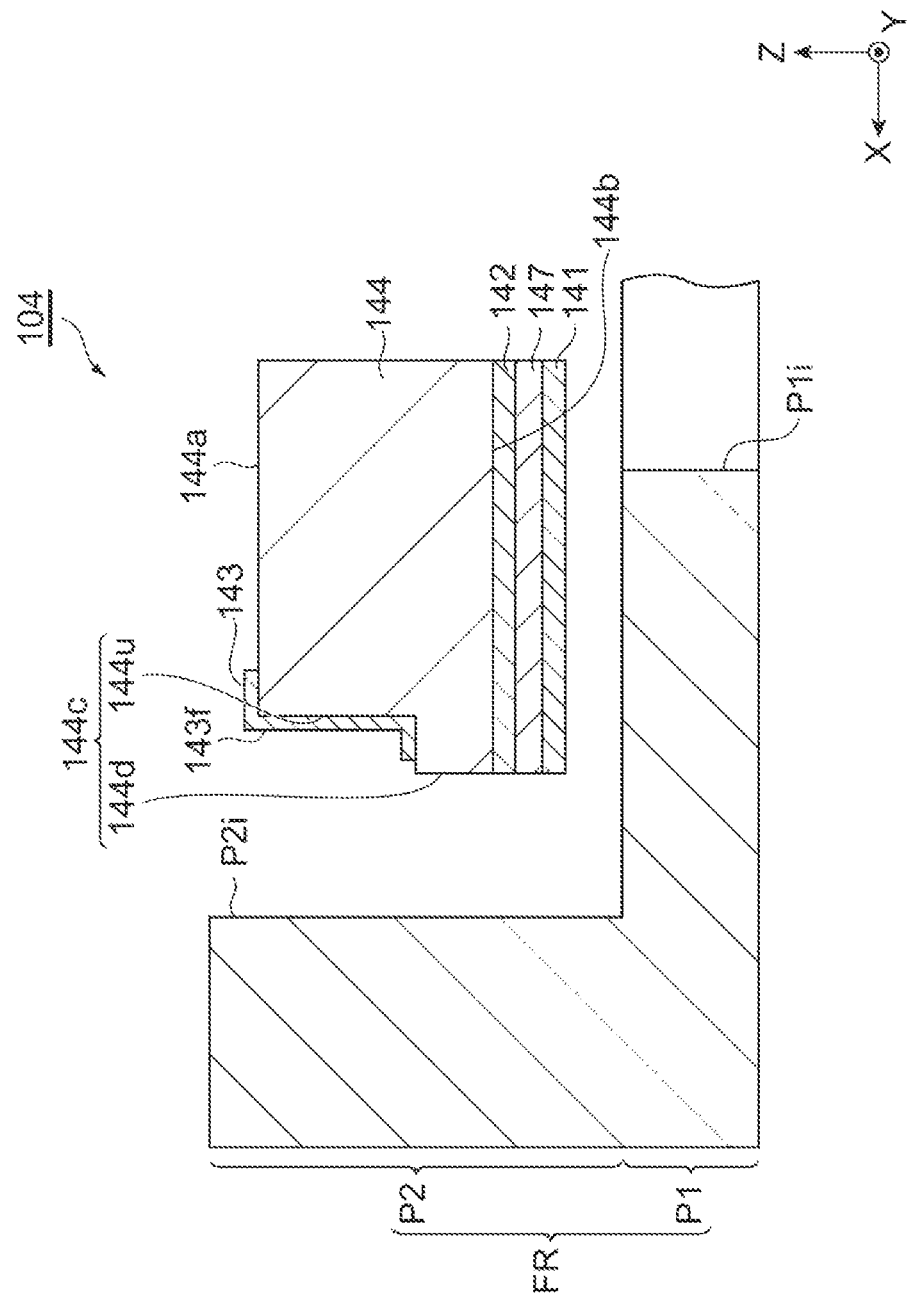
FIG. 7 is a sectional view taken along line VII-VII in FIG. 6.

Hereinafter, the first sensor will be described in detail. FIG. 6 is a perspective view illustrating an example of the sensor. FIG. 7 is a sectional view taken along line VII-VII in FIG. 6. The first sensor 104 illustrated in FIGS. 6 and 7 is a sensor utilized as the plurality of first sensors 104A to 104C of the measuring instrument 100 and is configured as a chip component in an example. In the description below, an XYZ orthogonal coordinate system will be adopted as a reference, as necessary. An X-direction indicates the forward direction of the first sensor 104. A Y-direction indicates a direction orthogonal to the X-direction, that is, the width direction of the first sensor 104. A Z-direction indicates a direction orthogonal to the X-direction and the Y-direction, that is, the upward direction of the first sensor 104. FIG. 7 illustrates the focus ring FR together with the first sensor 104.

The first sensor 104 includes an electrode 141, a guard electrode 142, a sensor electrode 143, a substrate portion 144, and an insulation region 147.

The substrate portion 144 is made of, for example, borosilicate glass or quartz. The substrate portion 144 has a top surface 144a, a lower surface 144b, and a front side end surface 144c. The guard electrode 142 is provided below the lower surface 144b of the substrate portion 144 and extends in the X-direction and the Y-direction. In addition, the electrode 141 is provided below the guard electrode 142 via the insulation region 147 and extends in the X-direction and the Y-direction. For example, the insulation region 147 is formed of $SiO_2$, $SiN$, $Al_2O_3$, or polyimide.

The front side end surface 144c of the substrate portion 144 is formed in a stepped shape. A lower portion 144d of the front side end surface 144c protrudes toward the focus ring FR side beyond an upper portion 144u of the front side end surface 144c. The sensor electrode 143 extends along the upper portion 144u of the front side end surface 144c. In one exemplary embodiment, the upper portion 144u and the lower portion 144d of the front side end surface 144c are curved surfaces each having a predetermined curvature. In other words, the upper portion 144u of the front side end surface 144c has a constant curvature at any position of the upper portion 144u, and the curvature of the upper portion 144u is a reciprocal of the distance between a central axis AX100 of the measuring instrument 100 and the upper portion 144u of the front side end surface 144c. In addition, the lower portion 144d of the front side end surface 144c has a constant curvature at any position of the lower portion 144d, and the curvature of the lower portion 144d is a reciprocal of the distance between the central axis AX100 of the measuring instrument 100 and the lower portion 144d of the front side end surface 144c.

The sensor electrode 143 is provided along the upper portion 144u of the front side end surface 144e. In one exemplary embodiment, a front surface 143f of the sensor electrode 143 is also curved. In other words, the front surface 143f of the sensor electrode 143 has a constant curvature at any position of the front surface 143f, and the curvature is a reciprocal of the distance between the central axis AX100 of the measuring instrument 100 and the front surface 143f.

In a case where the first sensor 104 is used as the sensor of the measuring instrument 100, the electrode 141 is connected to a wiring 181, the guard electrode 142 is connected to a wiring 182, and the sensor electrode 143 is connected to a wiring 183.

In the first sensor 104, the sensor electrode 143 is shielded from the lower portion of the first sensor 104 by the electrode 141 and the guard electrode 142. Therefore, according to the first sensor 104, the electrostatic capacity can be measured with high directivity in a particular direction, that is, in a direction in which the front surface 143f of the sensor electrode 143 is oriented (X-direction).

Figure 8:
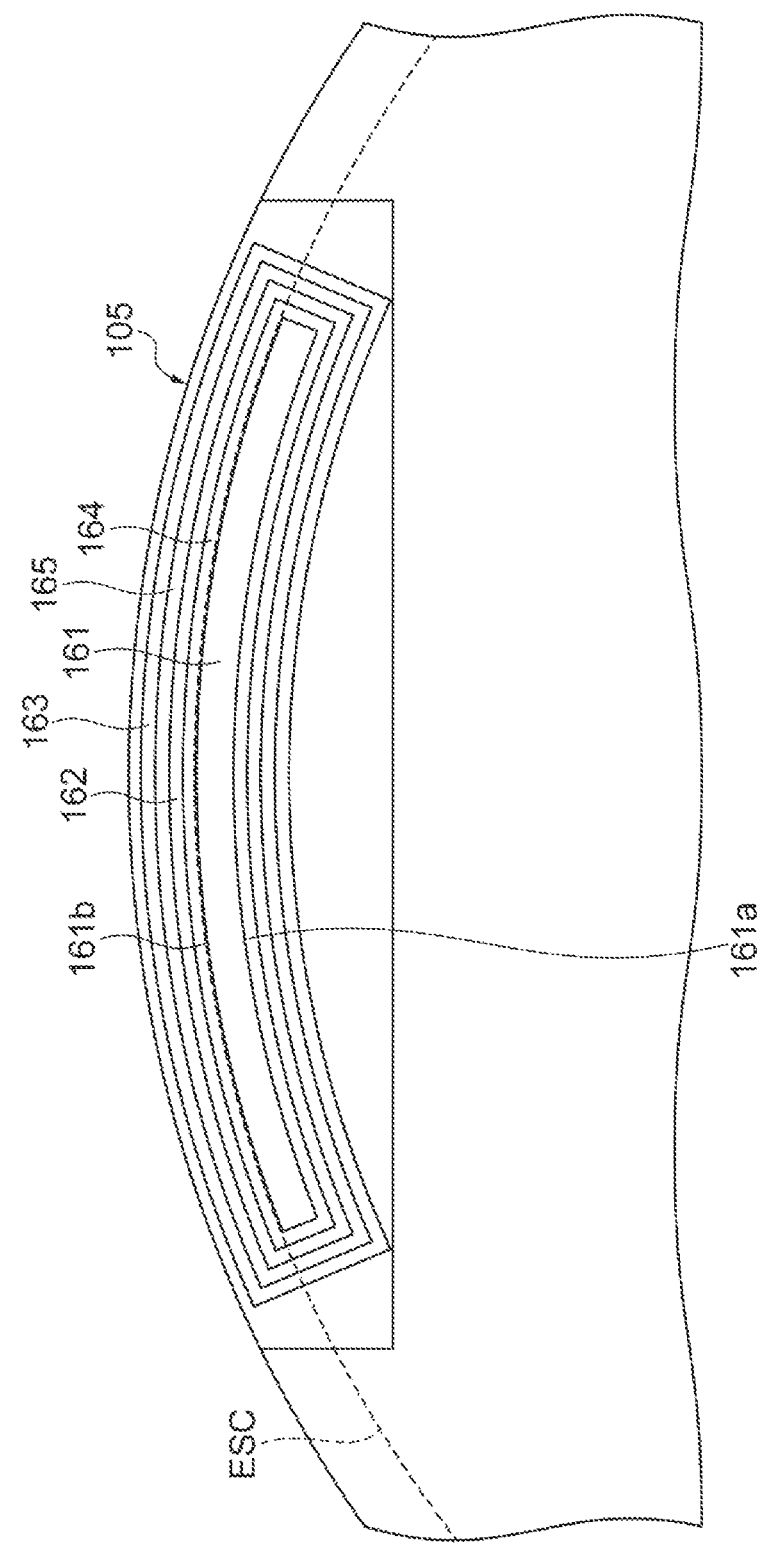
FIG. 8 is an enlarged view of a second sensor in FIG. 5.

Hereinafter, the second sensors will be described in detail. FIG. 8 is a partially enlarged view of FIG. 5 and illustrates one second sensor. The edge of the sensor electrode 161 has a partially arc shape. In other words, the sensor electrode 161 has a planar shape which is defined by an inner edge (second edge) 161a and an outer edge (first edge) 161b which are two arcs having radiuses different from each other around the central axis AX100. The outer edge 161b on the outer side in the radial direction in each sensor electrode 161 of the plurality of second sensors 105A to 105C extends on a common circle. In addition, the inner edge 161a on the inner side in the radial direction in each sensor electrode 161 of the plurality of second sensors 105A to 105C extends on another common circle. The curvature of a part of the edge of the sensor electrode 161 coincides with the curvature of the edge of the electrostatic chuck ESC. In one exemplary embodiment, the curvature of the outer edge 161b forming the edge on the outer side in the radial direction in the sensor electrode 161 coincides with the curvature of the edge of the electrostatic chuck ESC. In addition, the curvature center of the outer edge 161b, that is, the center of a circle on which the outer edge 161b extends shares the central axis AX100.

In one exemplary embodiment, each of the second sensors 105A to 105C further includes a guard electrode 162 that surrounds the sensor electrode 161. The guard electrode 162 has a frame shape and surrounds the sensor electrode 161 over the whole periphery. The guard electrode 162 and the sensor electrode 161 are separated from each other such that an insulation region 164 is interposed therebetween. In addition, in one exemplary embodiment, each of the second sensors 105A to 105C further includes an electrode 163 that surrounds the guard electrode 162 on the outside of the guard electrode 162. The electrode 163 has a frame shape and surrounds the guard electrode 162 over the whole periphery. The guard electrode 162 and the electrode 163 are separated from each other such that an insulation region 165 is interposed therebetween.

Figure 9:
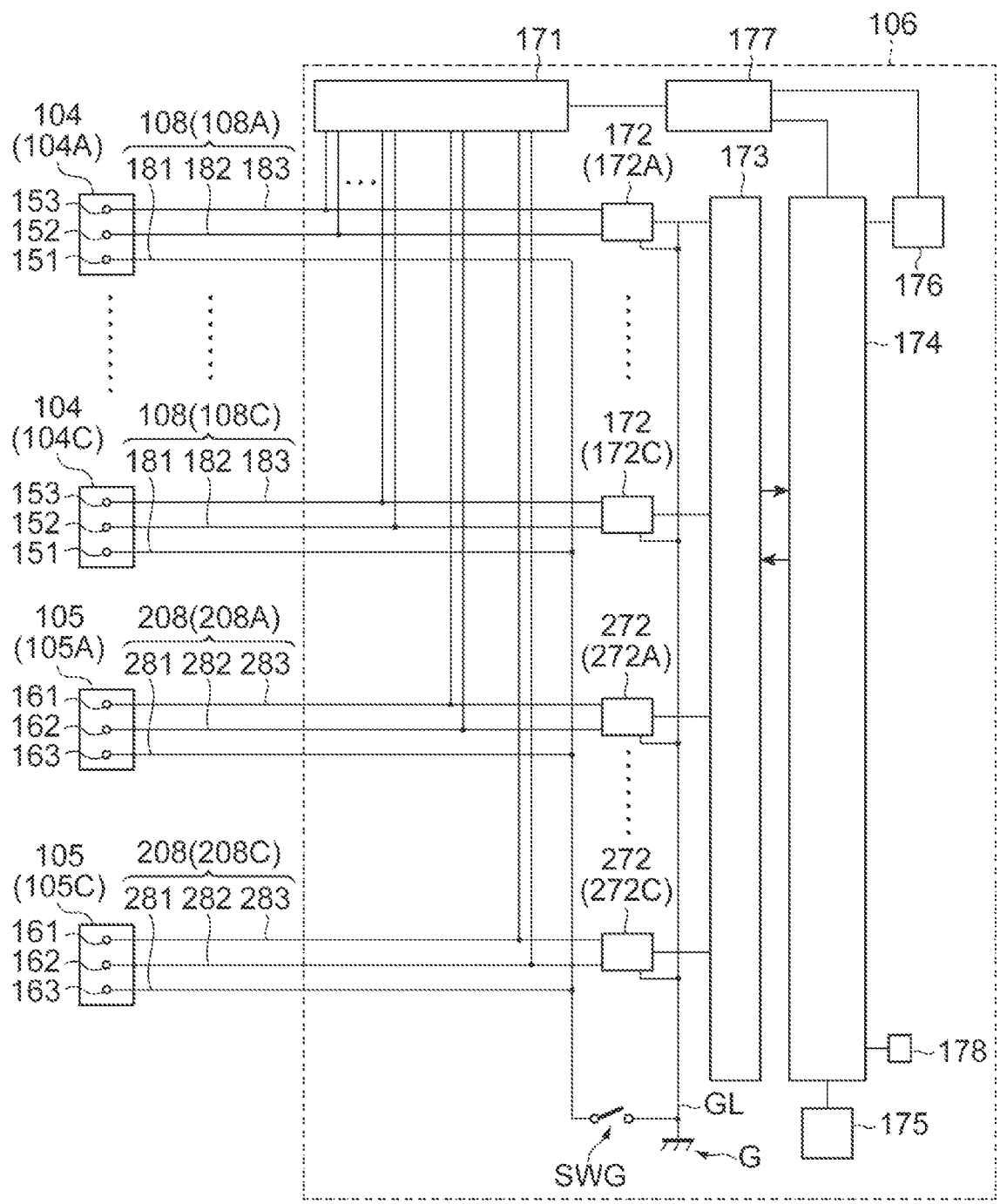
FIG. 9 is a view illustrating a configuration of a circuit board of the measuring instrument.

Hereinafter, the configuration of the circuit hoard 106 will be described. FIG. 9 is a view illustrating a configuration of the circuit board of the measuring instrument. The circuit board 106 has a high frequency oscillator 171, a plurality of C/V conversion circuits 172A to 172C, a plurality of C/V conversion circuits 272A to 272C, an A/D converter 173, a processor (arithmetic unit) 174, a storage device 175, a communication device 176, and a power source 177.

Each of the plurality of first sensors 104A to 104C is connected to the circuit board 106 via the corresponding wiring group among the plurality of wiring groups 108A to 108C. In addition, each of the plurality of first sensors 104A to 104C is connected to the corresponding C/V conversion circuit among the plurality of C/V conversion circuits 172A to 172C via several wirings included in the corresponding wiring group. Each of the plurality of second sensors 105A to 105C is connected to the circuit board 106 via the corresponding wiring group among the plurality of wiring groups 208A to 208C. In addition, each of the plurality of second sensors 105A to 105C is connected to the corresponding C/V conversion circuit among the plurality of C/V conversion circuits 272A to 272C via several wirings included in the corresponding wiring group. Hereinafter, one first sensor 104 having the same configuration as each of the plurality of first sensors 104A to 104C will be described. Similarly, one wiring group 108 having the same configuration as each of the plurality of wiring groups 108A to 108C will be described. One C/V conversion circuit 172 having the same configuration as each of the plurality of C/V conversion circuits 172A to 172C will be described. One second sensor 105 having the same configuration as each of the plurality of second sensors 105A to 105C will be described. One wiring group 208 having the same configuration as each of the plurality of wiring groups 208A to 208C will be described. One C/V conversion circuit 272 having the same configuration as each of the plurality of C/V conversion circuits 272A to 272C will be described.

The wiring group 108 includes the wirings 181 to 183. One end of the wiring 181 is connected to a pad 151 which is connected to the electrode 141. The wiring 181 is connected to a ground potential line GL which is connected to a ground G of the circuit board 106. The wiring 181 may be connected to the ground potential line GL via a switch SWG. In addition, one end of the wiring 182 is connected to a pad 152 which is connected to the guard electrode 142, and the other end of the wiring 182 is connected to the C/V conversion circuit 172. In addition, one end of the wiring 183 is connected to the pad 153 which is connected to the sensor electrode 143, and the other end of the wiring 183 is connected to the C/V conversion circuit 172.

The wiring group 208 includes the wirings 281 to 283. One end of the wiring 281 is connected to the electrode 163. The wiring 281 is connected to the ground potential line GL which is connected to the ground G of the circuit board 106. The wiring 281 may be connected to the ground potential line GL via the switch SWG. In addition, one end of the wiring 282 is connected to the guard electrode 162, and the other end of the wiring 282 is connected to the C/V conversion circuit 272. In addition, one end of the wiring 283 is connected to the sensor electrode 161, and the other end of the wiring 283 is connected to the C/V conversion circuit 272.

The high frequency oscillator 171 is connected to the power source 177 such as a battery and is configured to receive electric power from the power source 177 to generate a high frequency signal. The power source 177 is also connected to the processor 174, the storage device 175, and the communication device 176. The high frequency oscillator 171 has a plurality of output lines. The high frequency oscillator 171 applies the generated high frequency signal to the wiring 182, the wiring 183, the wiring 282, and the wirings 283 via the plurality of output lines. Therefore, the high frequency oscillator 171 is electrically connected to the guard electrode 142 and the sensor electrode 143 of the first sensor 104, and the high frequency signal from the high frequency oscillator 171 is applied to the guard electrode 142 and the sensor electrode 143. In addition, the high frequency oscillator 171 is electrically connected to the sensor electrode 161 and the guard electrode 162 of the second sensor 105, and the high frequency signal from the high frequency oscillator 171 is applied to the sensor electrode 161 and the guard electrode 162.

The wiring 182 and the wiring 183 are connected to an input of the C/V conversion circuit 172. That is, the guard electrode 142 and the sensor electrode 143 of the first sensor 104 are connected to the input of the C/V conversion circuit 172. In addition, the sensor electrode 161 and the guard electrode 162 are connected to the inputs of the C/V conversion circuits 272, respectively. The C/V conversion circuit 172 and the C/V conversion circuit 272 are configured to generate a voltage signal having an amplitude that corresponds to the potential difference at the input and output the voltage signal. As the electrostatic capacity of the sensor electrode connected to the C/V conversion circuit 172 becomes greater, the magnitude of the voltage of the voltage signal output by the C/V conversion circuit 172 increases. Similarly, as the electrostatic capacity of the sensor electrode connected to the C/V conversion circuit 272 becomes greater, the magnitude of the voltage of the voltage signal output by the C/V conversion circuit 272 increases. The high frequency oscillator 171, the wiring 282, the wiring 283, and the C/V conversion circuit 272 are connected in the same manner as the high frequency oscillator 171, the wiring 182, the wiring 183, and the C/V conversion circuit 172.

The outputs of the C/V conversion circuit 172 and the C/V conversion circuit 272 are connected to the input of the A/D converter 173. In addition, the A/D converter 173 is connected to the processor 174. The A/D converter 173 is controlled based on a control signal from the processor 174, converts the output signal (voltage signal) of the C/V conversion circuit 172 and the output signal (voltage signal) of the C/V conversion circuit 272 to digital values, and outputs the converted digital values to the processor 174 as detection values.

The storage device 175 is connected to the processor 174. The storage device 175 is a storage device such as a volatile memory and is configured to store measurement data, which will be described later. In addition, another storage device 178 is connected to the processor 174. The storage device 178 is a storage device such as a non-volatile memory and stores a program which is read and executed by the processor 174.

The communication device 176 is a communication device that is compliant with any wireless communication standard. For example, the communication device 176 is compliant with Bluetooth (registered trademark). The communication device 176 is configured to wirelessly transmit the measurement data stored in the storage device 175.

The processor 174 is configured to control each part of the measuring instrument 100 by executing the above-described program. For example, the processor 174 controls the supply of the high frequency signal from the high frequency oscillator 171 to the guard electrode 142, the sensor electrode 143, the sensor electrode 161, and the guard electrode 162. The processor 174 controls power supply from the power source 177 to the storage device 175, power supply from the power source 177 to the communication device 176, and the like. Furthermore, the processor 174 acquires the measurement value of the first sensor 104 and the measurement value of the second sensor 105 based on the detection value input from the A/D converter 173 by executing the above-described program.

In the above-described measuring instrument 100, in a state where the measuring instrument 100 is disposed in a region surrounded by the focus ring FR, the plurality of sensor electrodes 143 and guard electrodes 142 face the inner edge of the focus ring FR. The measurement values generated based on the voltage difference between the signal of the sensor electrode 143 and the signal of the guard electrode 142 represents the electrostatic capacities that reflect the distances between each of the plurality of sensor electrodes 143 and the focus ring. An electrostatic capacity C is represented by C=εS/d is a dielectric constant of a medium between the front surface 143f of the sensor electrode 143 and the inner edge of the focus ring FR. S indicates the area of the front surface 143f of the sensor electrode 143. d can be regarded as the distance between the front surface 143f of the sensor electrode 143 and the inner edge of the focus ring FR. Therefore, according to the measuring instrument 100, the measurement data that reflects a relative positional relationship between the measuring instrument 100 copying the workpiece W, and the focus ring FR can be obtained. For example, the plurality of measurement values acquired by the measuring instrument 100 become smaller as the distances between the front surfaces 143f of the sensor electrode 143 and the inner edge of the focus ring FR increases.

Further, in a state where the measuring instrument 100 is placed on the electrostatic chuck ESC, the plurality of sensor electrodes 161 face the electrostatic chuck ESC. Considering one sensor electrode 161, in a case where the sensor electrode 161 is deviated radially outward with respect to the electrostatic chuck ESC, the electrostatic capacity measured by the sensor electrode 161 becomes smaller than the electrostatic capacity in a case where the measuring instrument 100 is transferred at a predetermined transfer position. In addition, in a case where the sensor electrode 161 is deviated radially inward with respect to the electrostatic chuck ESC, the electrostatic capacity measured by the sensor electrode 161 becomes greater than the electrostatic capacity in a case where the measuring instrument 100 is transferred at a predetermined transfer position.

Hereinafter, a method for obtaining a first amount of deviation which is an amount of deviation of the central position (central axis AX100) of the measuring instrument 100 disposed in the region with respect to the central position (central axis AXF) of the region surrounded by the focus ring FR, will be described.

Figure 10:
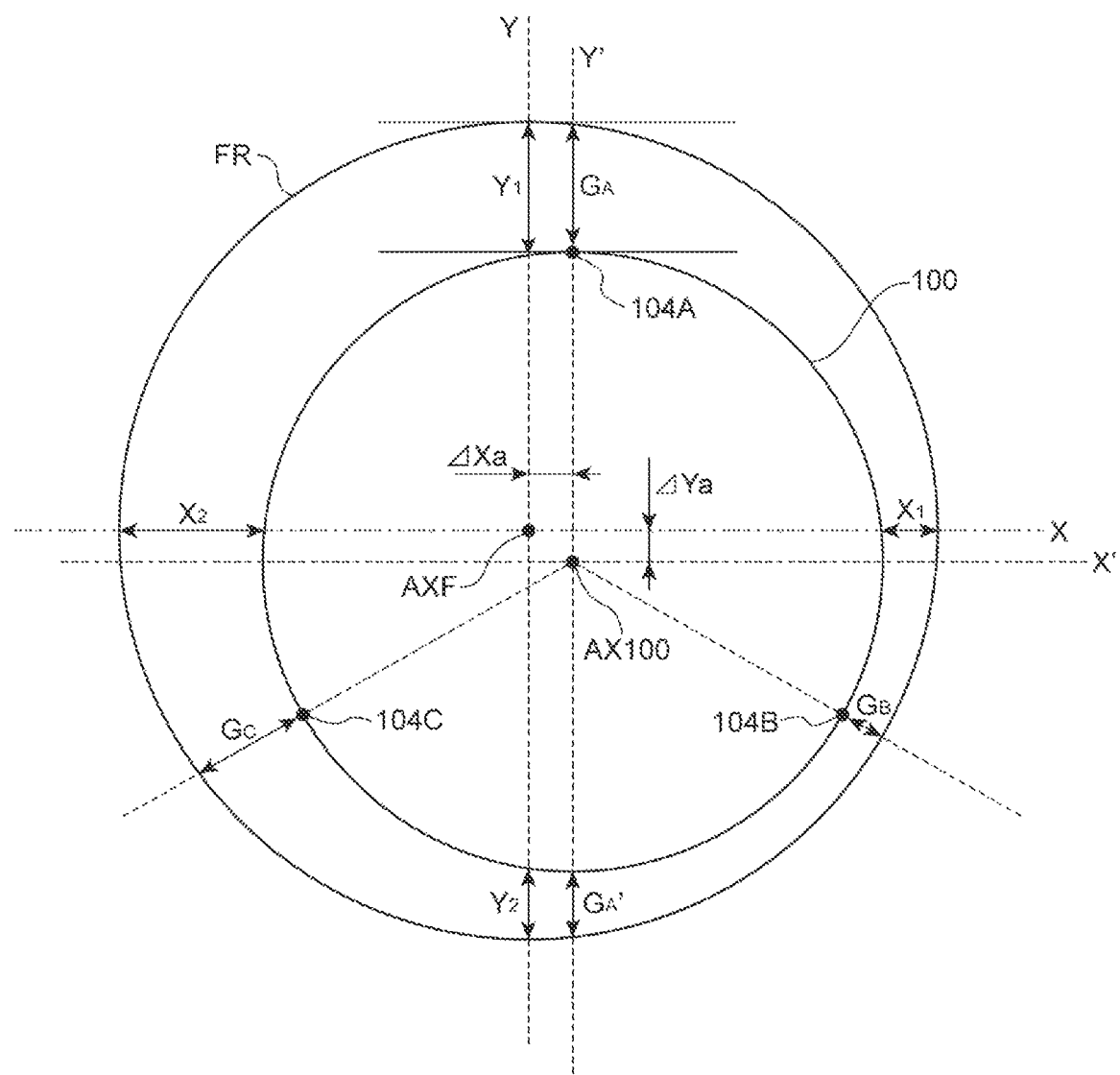
FIG. 10 is a view schematically illustrating an example of a positional relationship between a focus ring and the measuring instrument.

FIG. 10 schematically illustrates the positional relationship between the focus ring FR and the measuring instrument 100 disposed inside the focus ring FR. In FIG. 10, the inner periphery of the focus ring FR and the edge of the measuring instrument 100 are illustrated. In FIG. 10, an orthogonal coordinate system based on the X axis and the Y axis with the central axis AXF of the focus ring FR as the origin, and an orthogonal coordinate system based on an X' axis and a Y' axis with the central axis AX100 of the measuring instrument 100 as the origin, are illustrated. In the illustrated example, the Y' axis is set to pass through the first sensor 104A.

As illustrated in the drawing, the amount of deviation between the central axis AXF of the focus ring FR and the central axis AX100 of the measuring instrument 100 is represented by ΔXa and ΔYa. Hereinafter, a method for deriving ΔXa and ΔYa will be described. In one exemplary embodiment, three first sensors 104A, 104B, and 104C are equally provided on the peripheral edge of the base substrate 102 at intervals of 120° in the peripheral direction. Accordingly, a sum A of each shortest distance from the plurality of sensor electrodes 143 to the inner peripheral surface of the focus ring FR is a constant value. In the illustrated example, the inner diameter $D_f$ of the focus ring FR is 302 mm, and the diameter $D_w$ of the measuring instrument 100 is 300 mm. The shortest distance from the first sensor 104A to the inner peripheral surface of the focus ring FR is $G_A$. The shortest distance from the first sensor 104B to the inner peripheral surface of the focus ring FR is $G_B$. The shortest distance from the first sensor 104C to the inner peripheral surface of the focus ring FR is $G_C$. In this case, Equation (3) below is established.

$$((D_f-D_w)/2) \times 3 = G_A + G_B + G_C = 3.00 \text{ mm} \qquad \text{Equation (3)}$$

Here, as described above, since the electrostatic capacity C is represented by C=εS/d, the distance d is represented by d=εS/C. When "εS" is a constant a, the distance d is d=a/C. The distance d corresponds to $G_A$, $G_B$, and $G_C$ in the equation above. When the measurement value (electrostatic capacity) by the first sensor 104A is $C_A$, the measurement value by the first sensor 1041 is $C_B$, and the measurement value by the first sensor 104C is $C_C$, $G_A=a/C_A$, $G_B=a/C_B$, and $G_C=a/C_C$ is established. In other words, Equation (3) is converted into Equation (4) below.

$$(a/C_A)+(a/C_B)+(a/C_c)=3.00 \text{ mm} \qquad (4)$$

In addition, Equation (4) can be generalized similar to Equation (5) below. In other words, when the measurement values by the N first sensors 104 are Ci (i=1, 2, 3, . . . , and N), Equation (5) is established. In a case where the sum A of the shortest distances from the N first sensors 104 to the inner peripheral surface of the focus ring FR is a constant value, the sum A can be calculated by $((D_f-D_w)/2) \times N$.

$$\sum_{i=1}^{N} \frac{a}{C_i} = A \qquad (5)$$

In a case of deriving Xa and ΔYa, first, the respective measurement values $C_A$, $C_B$, and $C_C$ of the first sensors 104A, 104B, and 104C are acquired. By substituting the measurement values $C_A$, $C_B$, and $C_C$ into Equation (4) above, the constant a can be obtained. The distances $G_A$, $G_B$, and $G_C$ are derived based on the constant a and each of the measurement values $C_A$, $C_B$, and $C_C$.

As described in one exemplary embodiment, in a case where the difference between the inner diameter $D_f$ of the focus ring FR and the diameter $D_w$ of the measuring instrument 100 is sufficiently smaller than the inner diameter $D_f$ of the focus ring FR, Expression (6) below is established. In other words, the magnitude of $G_A$ can be approximated as a distance $Y_1$ from the inner periphery of the focus ring FR on the Y axis to the edge of the measuring instrument 100.

$$G_A \approx Y_1 \quad (6)$$

When the distance from the position symmetrical to the first sensor 104A around the origin (central axis AX100) to the inner periphery of the focus ring FR is $G_A'$, similarly, Expression (7) below is established. In other words, the magnitude of $G_A'$ can be approximated to a distance $Y_2$ from the inner periphery of the focus ring FR on the Y axis to the edge of the measuring instrument 100.

$$G_A' \approx Y_2 \quad (7)$$

Here, both $Y_1$ and $Y_2$ are distances on the Y axis. Therefore, the sum of $Y_1$ and $Y_2$ can be approximated as the difference between the inner diameter $D_f$ of the focus ring FR and the diameter $D_w$ of the measuring instrument 100. In other words, Expression (8) below is established based on Expressions (6) and (7).

$$Y_1 + Y_2 \approx G_A + G_A' \approx 2 \quad (8)$$

Since $\Delta Ya$ can be defined as ½ of the difference between $Y_2$ and $Y_1$, $\Delta Ya$ can be obtained from the distance $G_A$ as illustrated in Equation (9) below.

$$\Delta Ya = (Y_2 - Y_1)/2 = 1 - G_A \quad (9)$$

Similarly, when the distances from the edge of the measuring instrument 100 to the inner periphery of the focus ring FR on the X axis are $X_1$ and $X_2$, respectively, Expression (10) below is established.

$$X_1 + X_2 \approx 2 \quad (10)$$

Further, the ratio of the shortest distance $G_B$ from the first sensor 104B to the focus ring FR and the shortest distance $G_C$ from the first sensor 104C to the focus ring FR is represented by Equation (11) below.

$$X_1 : X_2 = G_B : G_C \quad (11)$$

Here, assuming that $G_C + G_B = Z$, $X_1$ and $X_2$ are represented by Equations (12) and (13) below from Equations (10) and (11), respectively.

$$X_1 = 2G_B/Z = 2G_B/(G_C + G_B) \quad (12)$$

$$X_2 = 2G_C/Z = 2G_C/(G_C + G_B) \quad (13)$$

Accordingly, since $\Delta Xa$ can be defined as Equation (14) below, $\Delta Xa$ can be obtained from the distances $G_C$ and $G_B$.

$$\Delta Xa = (X_2 - X_1)/2 = (G_C - G_B)/(G_C + G_B) \quad (14)$$

As described above, in one exemplary embodiment, the first amount of deviation which is an amount of deviation between the central axis AXF of the focus ring FR and the central axis AX100 of the measuring instrument 100 disposed inside the focus ring FR, is obtained. The first amount of deviation can be calculated as the amount of deviation $\Delta Xa$ in the direction along the X axis and the amount of deviation $\Delta Ya$ in the direction along the Y axis.

Next, a method for obtaining the second amount of deviation which is an amount of deviation between the central position (central axis AXE) of the electrostatic chuck ESC and the central axis AX100 of the measuring instrument 100 disposed on the electrostatic chuck ESC will be described.

Figure 11:
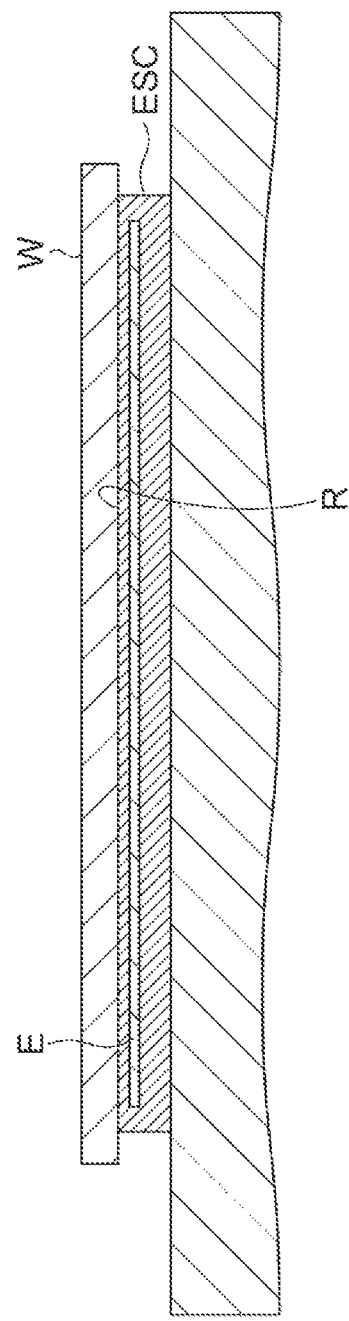
FIG. 11 is a sectional view schematically illustrating an electrostatic chuck.

FIG. 11 illustrates a sectional view of the electrostatic chuck and illustrates a state where the workpiece is placed on the electrostatic chuck. In one exemplary embodiment, the electrostatic chuck ESC has a ceramic body and an electrode E provided in the body. The body has a disc shape and has a peripheral edge that extends in the peripheral direction with respect to the center of the electrostatic chuck ESC. The electrode E has a disk shape and has a peripheral edge that extends in the peripheral direction with respect to the center of the electrostatic chuck ESC inside the peripheral edge of the body. The electrostatic chuck ESC has a placement region R on which the workpiece W and the measuring instrument 100 are placed. The placement region R has a circular edge. The workpiece W and the measuring instrument 100 have diameters greater than the diameter of the placement region R.

Figure 12A:
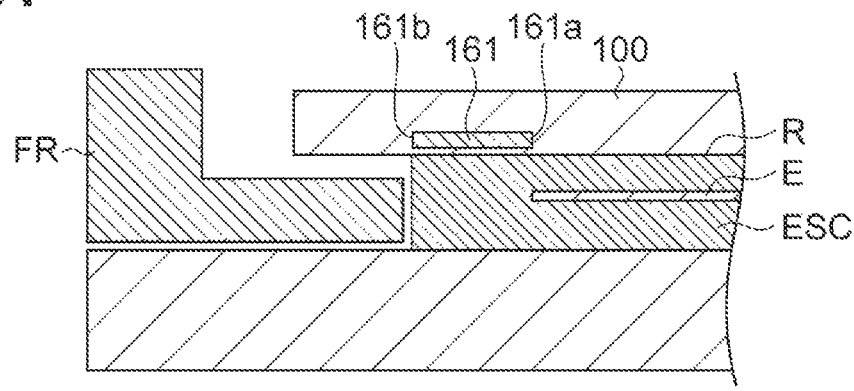
FIGS. 12A to 12C are a sectional view schematically illustrating an example of a positional relationship between the electrostatic chuck and the measuring instrument.
Figure 12B:
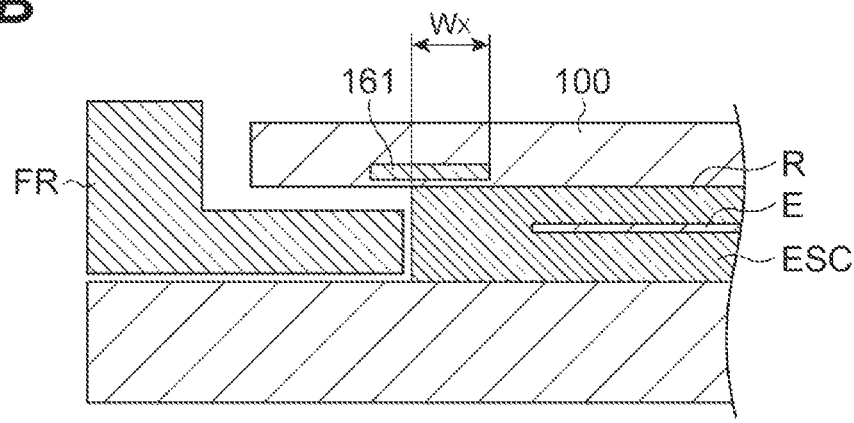
Figure 12C:
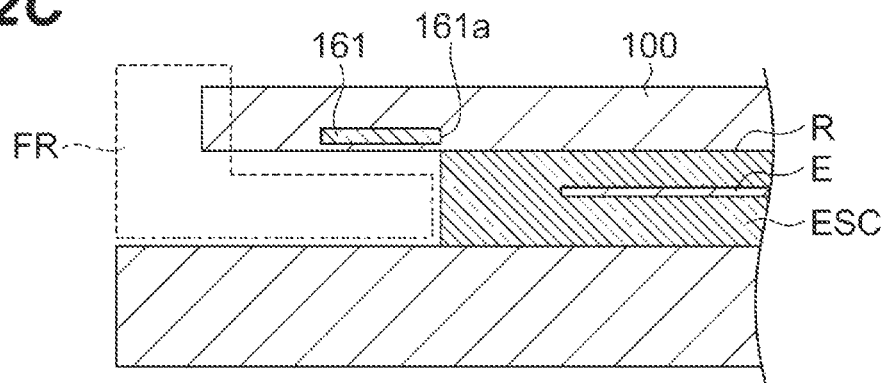

FIGS. 12A to 12C are a view illustrating the transfer position of the measuring instrument with respect to the placement region of the electrostatic chuck. FIG. 12A illustrates an arrangement in a case where the central position of the measuring instrument 100 and the central position of the electrostatic chuck coincide with each other. FIGS. 12B and 12C illustrate an arrangement in a case where the central position of the measuring instrument 100 and the central position of the electrostatic chuck are deviated from each other. In FIG. 12C, the focus ring FR and the measuring instrument 100 interfere with each other. In other words, in practice, the arrangement illustrated in FIG. 12C is achieved.

As illustrated in FIG. 12A, in a case where the central axis AX100 of the measuring instrument 100 and the central axis AXE of the electrostatic chuck ESC coincide with each other, the outer edge 161b (refer to FIG. 8) of the sensor electrode 161 and the outer edge of the electrostatic chuck ESC coincide with each other. In this case, the inner edge 161a (refer to FIG. 8) of the sensor electrode 161 may coincide with the outer edge of the electrode E. In other words, the outer edge 161b of the sensor electrode 161 extends on a first circle around the central axis AX100, and the first circle has the same radius as the radius of the peripheral edge of the body of the electrostatic chuck ESC. The inner edge 161a of the sensor electrode 161 extends on a second circle around the central axis AX100, and the second circle has the same radius as the radius of the peripheral edge of the electrode E of the electrostatic chuck ESC.

As described above, the electrostatic capacity C is represented by $C = \varepsilon S/d$. Here, the distance d is a distance from the sensor electrode 161 to the surface of the electrostatic chuck ESC and is constant. Meanwhile, S is the area of a part where the sensor electrode 161 and the electrostatic chuck ESC face each other. Therefore, the S varies depending on the positional relationship between the measuring instrument 100 and the electrostatic chuck ESC. For example, as illustrated in FIG. 12B, in the arrangement where an overlap length $W_X$ between the sensor electrode 161 and the electrostatic chuck ESC is small, S is small. Here, the overlap length can be defined as the shortest distance from the peripheral edge of the electrostatic chuck ESC to the inner edge 161a of the sensor electrode 161.

The shape of the sensor electrode 161 can be approximated by a rectangle having sides in a radial direction of a circle around the central axis AX100 and a direction orthogonal to the radial direction. In this case, S is represented by the product of the length of the side in the direction orthogonal to the radial direction and the overlap length $W_X$. When the length of the side in the direction orthogonal to the radial direction is Sa, S is represented by the product of Sa and $W_X$. In this case, C=εS/d can be transformed as C=ε·Sa·$W_X$/d. Accordingly, the overlap length $W_X$ is represented by Equation (15) below.

$$W_X = (d/(\varepsilon \cdot Sa))C \quad (15)$$

Here, by setting d/(ε·Sa) as a constant b, Equation (16) below is derived.

$$W_X = b \cdot C \quad (16)$$

As illustrated in FIG. 12C, the overlap length $W_X$ is zero in a state where the inner edge 161a of the sensor electrode 161 and the outer edge of the electrostatic chuck ESC coincide with each other. In this case, theoretically, the electrostatic capacity C measured by the sensor electrode 161 is zero. Therefore, in one exemplary embodiment, the second sensor 105 is calibrated such that the electrostatic capacity C becomes zero when the overlap length $W_X$ is zero. Meanwhile, in a case where the sensor electrode 161 moves to the central axis AXE side of the electrostatic chuck ESC from the state illustrated in FIG. 12A, the overlap length $W_X$ becomes larger than the length of the sensor electrode 161 in the radial direction. In this case, even when the overlap length $W_X$ increases, the value of S does not change. However, since the electrode E is disposed on the electrostatic chuck ESC, the electrostatic capacity C can be increased as the overlap length $W_X$ increases.

Figure 13:
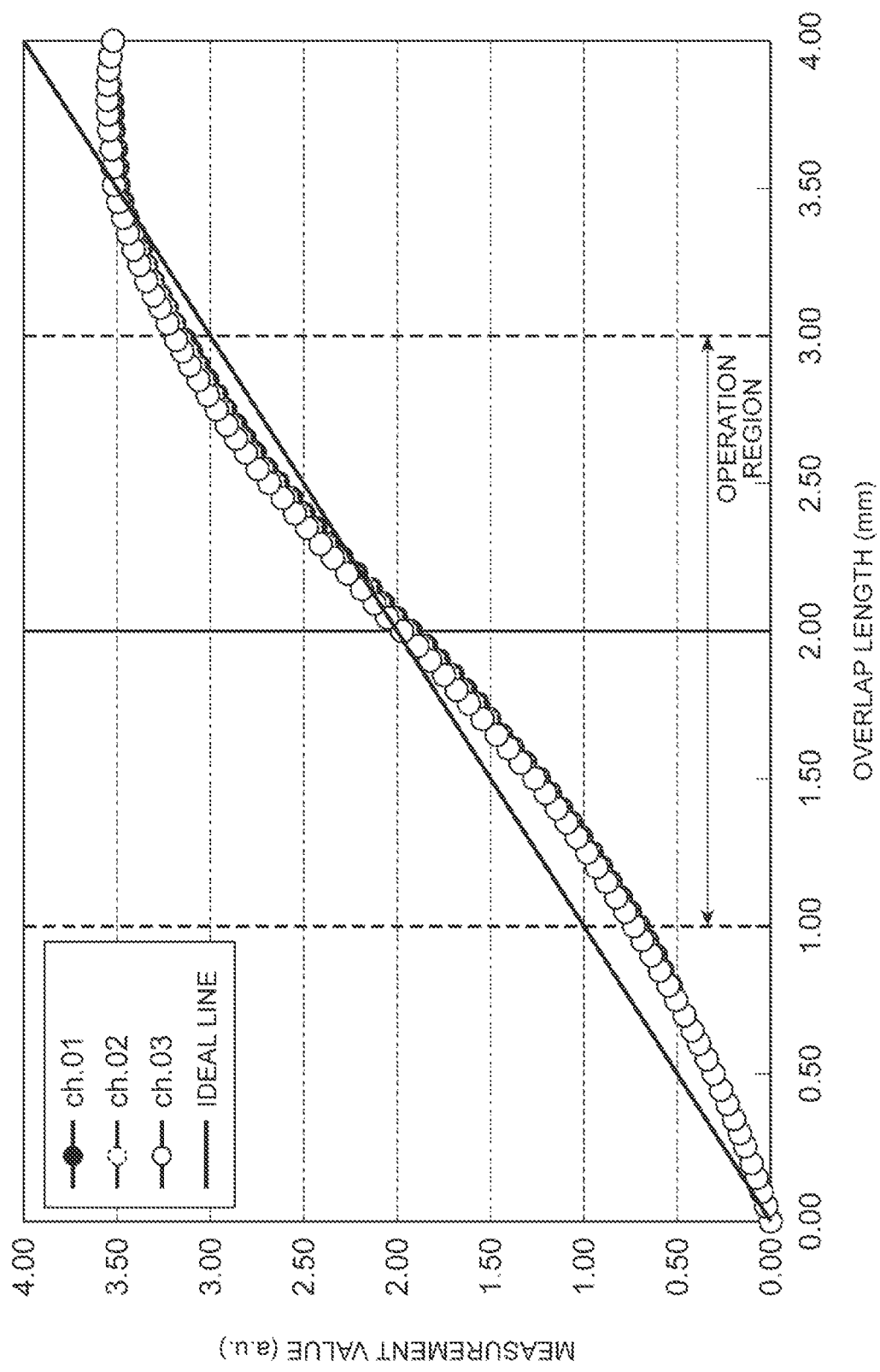
FIG. 13 is a graph illustrating an example of a relationship between an overlap length and a measurement value.

FIG. 13 is a graph illustrating a relationship between the overlap length and the measurement value that represents the electrostatic capacity C. In the graph of FIG. 13, for example, the measurement values measured by the second sensors 105A to 105C are plotted for each overlap length $W_X$. The measurement values of the second sensors 105A to 105C are ch.01 to ch.03, respectively. Moreover, in FIG. 13, an ideal line that represents the relationship between the overlap length and the electrostatic capacity is illustrated. The measurement values (electrostatic capacities) measured by the three second sensors rise substantially the same as the ideal line even when the overlap length $W_X$ is larger than the length of the sensor electrode 161 in the radial direction. In one exemplary embodiment, the difference between the inner diameter of the focus ring FR and the diameter of the measuring instrument 100 is 2 mm. Therefore, in the actual operation region, the overlap length $W_X$ is between 1.00 mm and 3.00 mm.

Figure 14:
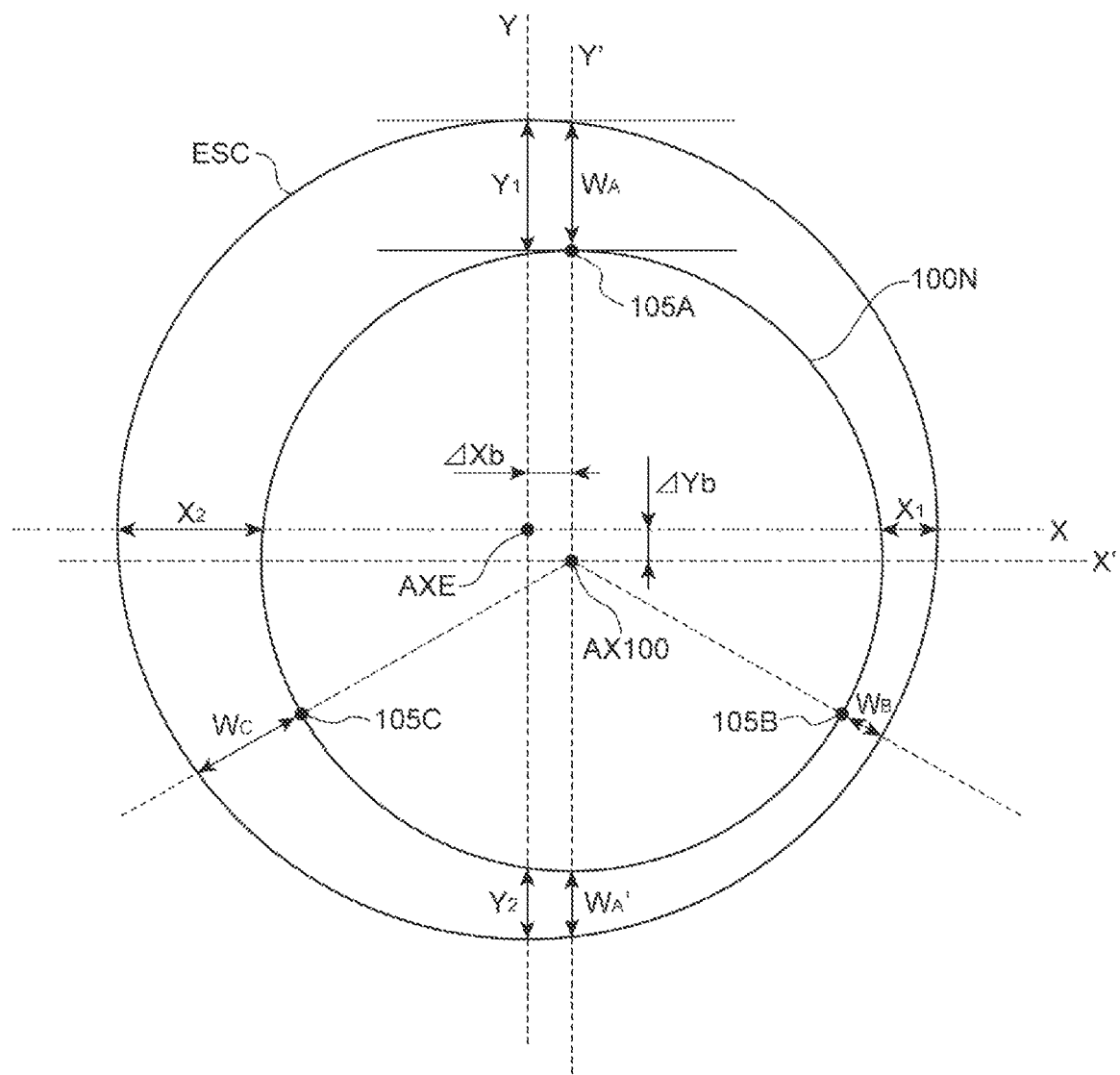
FIG. 14 is a view schematically illustrating an example of a positional relationship between the electrostatic chuck and the measuring instrument.

FIG. 14 schematically illustrates the positional relationship between the electrostatic chuck ESC and the measuring instrument 100 disposed at a position on the electrostatic chuck ESC. In FIG. 14, an outer edge of the electrostatic chuck ESC and a circle (second circle 100N) along the inner edge of the sensor electrode 161 in the measuring instrument 100 is illustrated. In FIG. 14, an orthogonal coordinate system based on the X axis and the Y axis with the central position of the electrostatic chuck ESC as the origin, and an orthogonal coordinate system based on the X' axis and the Y' axis with the central axis AX100 of the measuring instrument 100 as the origin, are illustrated. In the illustrated example, the Y' axis is set to pass through the second sensor 105A and the central position.

As illustrated in the drawing, the amount of deviation between the central position of the electrostatic chuck ESC and the central axis AX100 of the measuring instrument 100 is represented by ΔXb and ΔYb. Hereinafter, a method for deriving ΔXb and ΔYb will be described. In one exemplary embodiment, the three second sensors 105A, 105B, and 105C are equally disposed at intervals of 120° in the peripheral direction at the circumferential edge of the base substrate 102 such that a sum B of the shortest distances from the outer edge of the electrostatic chuck ESC to the inner edges of the plurality of sensor electrodes 161 has a constant value. In the illustrated example, a diameter $D_c$ of the electrostatic chuck ESC is 297 mm, a diameter $D_w$ of the circle along the inner edge of the sensor electrode 161 is 297 mm, and the length $W_s$ of the sensor electrode 161 in the radial direction is 2.00 mm. When the overlap length of the sensor electrode 161 of the second sensor 105A is $W_A$, the overlap length of the sensor electrode 161 of the second sensor 105B is $W_B$, and the overlap length of the sensor electrode 161 of the second sensor 105C is $W_C$, Equation (17) below is established.

$$(W_s - (W_d - D_e)/2) \times 3 = W_A + W_B + W_C = 6.00 \text{ mm} \quad \text{Equation (17)}$$

Here, since Equation (16) is established as described above, when the measurement value (electrostatic capacity) by the second sensor 105A is $D_A$, the measurement value by the second sensor 105B is $D_B$, and the measurement value by the second sensor 105C is $D_C$, $W_A = b \cdot D_A$, $W_B = b \cdot D_B$, and $W_C = b \cdot D_C$ are established. In other words, Equation (17) is converted into Equation (18).

$$(b \cdot D_A) + (b \cdot D_B) + (b \cdot D_C) = 6.00 \text{ mm} \quad (18)$$

The Equation (18) can be generalized similar to Equation (19) below using M measurement values Di (i=1, 2, 3, . . . , and M) in a case where the sum B of the overlap lengths of each sensor electrode 161 is a constant value.

In other words, when the measurement values by the M second sensors 105 are Di (i=1, 2, 3, . . . , and M), Equation (19) is established. In a case where the sum B of the overlap lengths of each sensor electrode 161 has a constant value, the sum B can be calculated by $$(W_s - (W_d - D_e)/2) \times M.$$

$$\sum_{i=1}^{M} b \cdot D_i = B \quad (19)$$

In a case of deriving ΔXb and ΔYb, first, the respective measurement values $D_A$, $D_B$, and $D_C$ of the second sensors 105A, 105B, and 105C are acquired. By substituting the measurement values $D_A$, $D_B$, and $D_C$ into Equation (18) above, the constant b can be obtained. Then, $W_A$, $W_B$, and $W_C$ are derived from the constant b and the respective measurement values $D_A$, $D_B$, and $D_C$.

The magnitude of $W_A$ can be approximated to the distance $Y_1$ from the outer edge of the electrostatic chuck ESC on the Y axis to the second circle 100N. In other words, Equation (20) below is established.

$$W_A \approx Y_1 \quad (20)$$

When the distance from the position symmetrical to the second sensor 105A around the origin (central axis AX100) to the second circle 100N to the outer edge of the electrostatic chuck ESC is $W_A'$, similarly, Expression (21) below is established. In other words, the magnitude of $W_A'$ can be approximated to the distance $Y_2$ from the outer edge of the electrostatic chuck ESC on the Y axis to the second circle 100N.

$$W_A' \approx Y_2 \quad (21)$$

Here, both $Y_1$ and $Y_2$ are distances on the Y axis. Therefore, the sum of $Y_1$ and $Y_2$ can be approximated to the difference between the diameter of the electrostatic chuck ESC and the diameter of the second circle 100N. In other words, Expression (22) below is established.

$$Y_1+Y_2 \approx W_A+W_A' \approx 4 \quad (22)$$

Since $\Delta Yb$ can be defined as ½ of the difference between $Y_2$ and $Y_1$, $\Delta Yb$ can be obtained from the distance $W_A$ as illustrated in Equation 23) below.

$$\Delta Yb=(Y_1-Y_2)/2=W_A-2 \quad (23)$$

Similarly, when the distances from the second circle 100N to the outer periphery of the electrostatic chuck ESC on the X axis are $X_1$ and $X_2$, respectively, Expression (24) below is established.

$$X_1+X_2 \approx 4 \quad (24)$$

Further, the ratio between the overlap length $W_B$ in the second sensor 105B and the overlap length $W_C$ in the second sensor 105C is represented by Equation (25) below.

$$X_1:X_2=W_B:W_C \quad \text{Equation (25)}$$

Here, assuming that $W_C+W_B=Z$, $X_1$ and $X_2$ are represented by Equations (26) and (27) below, respectively.

$$X_1=4W_B/Z=4W_B/(W_C+W_B) \quad (26)$$

$$X_2=4W_C/Z=4W_C/(W_C+W_B) \quad (27)$$

Accordingly, since $\Delta Xb$ can be defined as Equation (28) below, $\Delta Xb$ can be obtained from the overlap lengths $W_C$ and $W_B$.

$$\Delta Xb=(X_1-X_2)/2=2(W_B-W_C)/(W_B+W_C) \quad (28)$$

As described above, in one exemplary embodiment, the second amount of deviation which is an amount of deviation between the central axis AXE of the electrostatic chuck ESC and the central axis AX100 of the measuring instrument 100 disposed on the electrostatic chuck ESC is obtained. The second amount of deviation can be calculated as the amount of deviation $\Delta Xb$ in the direction along the X axis and the amount of deviation $\Delta Yb$ in the direction along the Y axis.

Figure 15:
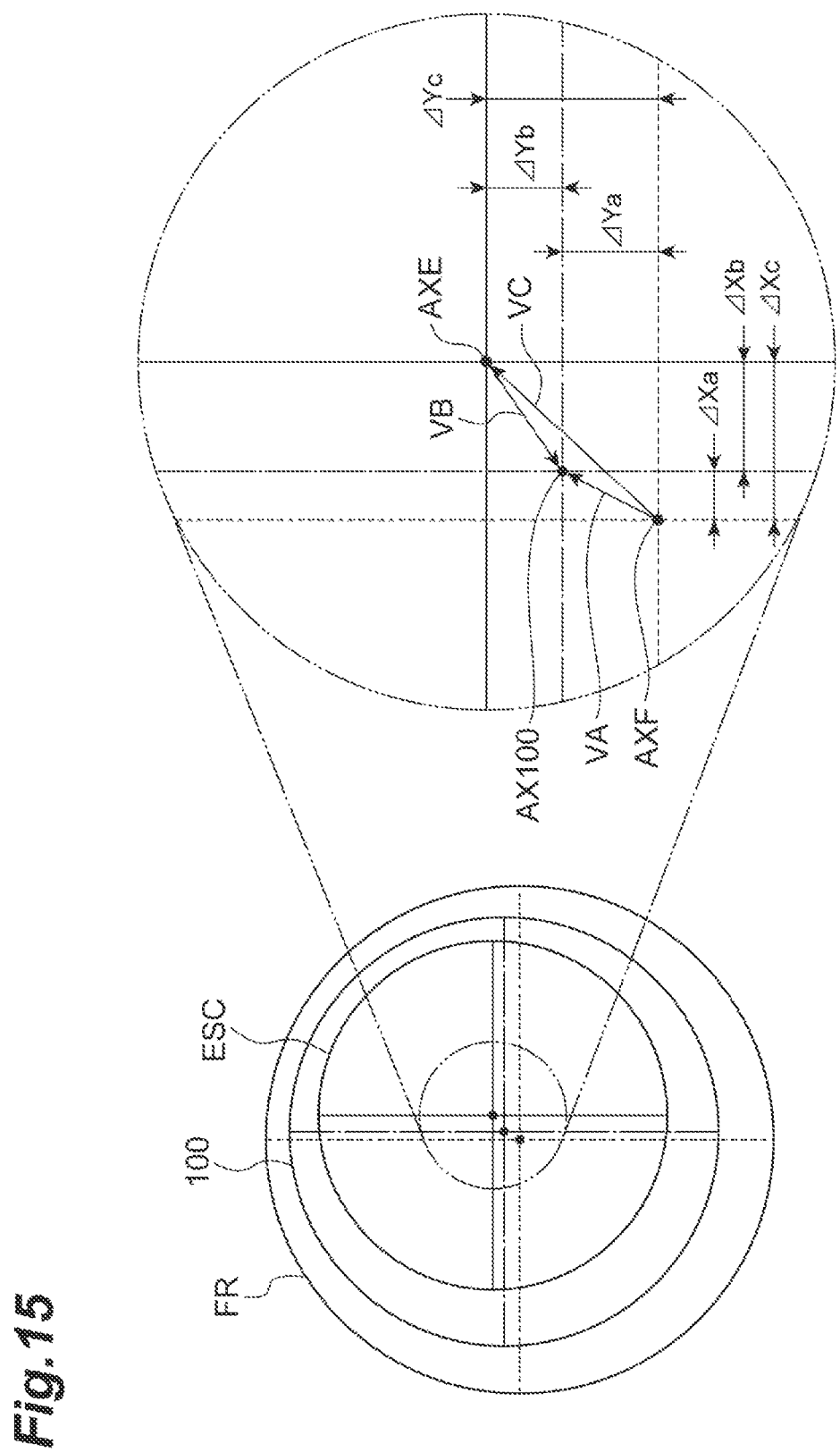
FIG. 15 is a view schematically illustrating an example of a positional relationship of the electrostatic chuck, the focus ring, and the measuring instrument.

Next, a method for obtaining the third amount of deviation which is an amount of deviation of the central position of the focus ring with respect to the central position of the electrostatic chuck ESC will be described. In addition, in one exemplary embodiment, by using the third amount of deviation, the transfer position data of the focus ring FR by the transfer unit is calibrated. FIG. 15 is a view schematically illustrating an example of a positional relationship of the electrostatic chuck ESC, the focus ring FR, and the measuring instrument 100. In FIG. 15, the peripheral edge of the electrostatic chuck ESC, the inner edge of the focus ring FR, and the peripheral edge of the measuring instrument 100 are illustrated. As illustrated in FIG. 15, the electrostatic chuck ESC and the measuring instrument 100 are disposed in the inner region FRI of the focus ring FR. The measuring instrument 100 is disposed at a position on the electrostatic chuck ESC.

The first amount of deviation described above can be expressed as a vector VA from the central axis AXF of the focus ring FR toward the central axis AX100 of the measuring instrument 100. The vector VA is represented by VA=($\Delta Xa$, $\Delta Ya$). Similarly, the second amount of deviation can be expressed as a vector VB from the central axis AXE of the electrostatic chuck ESC toward the central axis AX100 of the measuring instrument 100. The vector VB is represented by VB ($\Delta Xb$, $\Delta Yb$). In this case, a vector VC from the central axis AXF of the focus ring FR to the central axis AXE of the electrostatic chuck ESC is VA−VB, and is represented by VC=($\Delta Xa-\Delta Xb$, $\Delta Ya-\Delta Yb$). In other words, in a case where the third amount of deviation is obtained from the amount of deviation $\Delta Xc$ in the direction along the X axis and the amount of deviation $\Delta Yc$ in the direction along the Y axis, $\Delta Xc$ is $\Delta Xa-\Delta Xb$, and $\Delta Yc$ is $\Delta Ya-\Delta Yb$. As described above, in one exemplary embodiment, the third amount of deviation which is an amount of deviation between the central axis AXF of the electrostatic chuck ESC and the central axis AXF of the focus ring FR is obtained based on the first amount of deviation and the second amount of deviation.

Hereinafter, a transfer method of the focus ring FR in the transfer system S1 will be described. FIG. 16 is a flowchart illustrating a transfer method of the focus ring FR according to one exemplary embodiment. In a method MT illustrated in FIG. 16, as an example, a flow in a case of replacing the focus ring FR that has been consumed due to use with a new focus ring FR is illustrated. In a semiconductor manufacturing apparatus, such as the processing system 1, since the focus ring is consumed due to use, periodic replacement is necessary. When replacing the focus ring, it is important to dispose the workpiece. W and the focus ring FR in an optimal positional relationship in order to stabilize the productivity. In a case of confirming the installation position of the replaced focus ring, it is generally necessary to open the chamber. Therefore, the replacement work can be complicated. Here, it is desired to transfer the focus ring with high accuracy by a simple method.

As described above, the transfer unit TU2 in the processing system 1 is controlled by the controller MC. In one exemplary embodiment, the transfer unit TU2 can transfer the focus ring FR onto the second plate 18b based on the transfer position data transmitted from the controller MC. In addition, the transfer unit TU2 can transfer the workpiece W and the measuring instrument 100 onto the placement region R of the electrostatic chuck ESC based on the transfer position data transmitted from the controller MC.

In one example, any of the process modules PM1 to PM6 may be used as a storage location for the focus ring FR. As described above, the process modules PM1 to PM6 are airtightly connected to the transfer module TF via gate valves. In this case, the focus ring FR can be replaced by the transfer unit TU2 without opening the process module to the atmosphere.

In the method MT illustrated in FIG. 16, first, a step ST1 is executed. In step ST1, the focus ring FR consumed due to use is transferred out from the process module. The focus ring FR is supported on the second plate 18b. The upward movement of the lift pin 27a moves up the focus ring FR. By inserting the transfer arm TUa of the transfer unit TU2 into the gap between the raised focus ring FR and the second plate 18b, the focus ring FR is placed on the transfer arm TUa. The focus ring FR placed on the transfer arm TUa can be transferred to a predetermined position in the process module used as a storage location by the operation of the transfer unit TU2.

In subsequent step ST2, a new focus ring FR is transferred into the process module. For example, the transfer unit TU2 transfers the new focus ring FR onto the second plate 18b such that the electrostatic chuck ESC is positioned inside the region surrounded by the focus ring FR. The new focus ring FR is transferred by the transfer unit TU2 based on the transfer position data in a state of being placed on the transfer arm TUa. For example, the transfer position data may be coordinate data which is set in advance such that the central position of the focus ring FR coincides with the central position of the electrostatic chuck ESC. The transferred focus ring FR is supported by the lift pins 27a, and is placed at a position surrounding the electrostatic chuck ESC as the lift pins 27a are lowered.

In the subsequent step ST3, the measuring instrument 100 is transferred to the inner region FRI of the transferred focus ring FR. Specifically, the transfer unit TU1 transfers the measuring instrument 100 to one of the load lock module LL1 and the load lock module LL2. The transfer unit TU2 transfers the measuring instrument 100 to the process module from the load lock module based on the transfer position data, and the measuring instrument 100 is placed on the placement region R of the electrostatic chuck ESC. For example, the transfer position data is coordinate data which is set in advance such that the position of the central axis AX100 of the measuring instrument 100 coincides with the central position of the placement region R. Any of the process modules PM1 to PM6 may be used as a storage location for the measuring instrument 100.

In subsequent step ST4, the measurement value is acquired by the measuring instrument 100. Specifically, the measuring instrument 100 acquires the plurality of digital values (measurement values) depending on the magnitude of the electrostatic capacities between the focus ring FR and each sensor electrode 1611 of the first sensors 104A to 104C, and stores the plurality of digital values in the storage device 175. In addition, the measuring instrument 100 acquires the plurality of digital values (measurement values) depending on the magnitude of the electrostatic capacities between the placement region R of the electrostatic chuck ESC and each sensor electrode 161 of the second sensors 105A to 105C, and stores the plurality of digital values in the storage device 175. The plurality of digital values can be acquired at timing set in advance under the control of the processor 174.

In subsequent step ST5, the measuring instrument 100 is transferred out from the process module and returns to any of the transfer module TF, the load lock modules LL1, LL2, the loader module LM, and the containers 4a to 4d.

In subsequent step ST6, the first amount of deviation and the second amount of deviation are obtained using the above-described method for obtaining the amount of deviation based on the plurality of measurement values (measurement value group). In subsequent step ST7, the third amount of deviation which is an amount of deviation of the central axis AXE of the focus ring FR with respect to the central axis AXE of the electrostatic chuck ESC is obtained based on the first amount of deviation and the second amount of deviation which are obtained in step ST6. In steps ST6 and ST7 of one exemplary embodiment, first, the plurality of digital values stored in the storage device 175 are transmitted to the controller MC. The plurality of digital values may be transmitted from the communication device 176 to the controller MC in accordance with a command from the controller MC. Otherwise, the plurality of digital values may be transmitted to the controller MC at predetermined timing in accordance with the control of the processor 174 performed based on counting of a timer provided in the circuit board 106. Subsequently, based on the received plurality of digital values, the controller MC obtains the first amount of deviation, the second amount of deviation, and the third amount of deviation. In addition, the first amount of deviation, the second amount of deviation, and the third amount of deviation may be obtained by the processor 174 of the measuring instrument 100. In this case, the obtained first amount of deviation, the second amount of deviation, and third amount of deviation are transmitted to the controller MC.

In subsequent step ST8, it is determined whether or not the third amount of deviation exceeds a predetermined threshold value. In a case where it is determined that the third amount of deviation is equal to or less than the predetermined threshold value, it is confirmed that the focus ring FR has been accurately transferred. In this case, the method MT ends. Meanwhile, in a case where it is determined that the amount of deviation is larger than the threshold value, the process proceeds to step ST9. In step ST9, the transfer position of the focus ring FR is adjusted such that the central position of the electrostatic chuck ESC and the central position of the focus ring FR coincide with each other based on the third amount of deviation. For example, the transfer position data is revised by the controller MC such that the third amount of deviation is eliminated. In addition, the focus ring FR is transferred again by the transfer unit TU2 such that the central position of the focus ring FR coincides with the central position of the electrostatic chuck ESC based on the revised transfer position data. In this case, for example, the focus ring FR is once transferred out from the second plate 18b to the process module used as a storage location. The focus ring FR is supported again by the transfer arm TUa, and the focus ring FR is transferred onto the second plate 18b. At this time, the transfer position of the focus ring FR is adjusted by adjusting the transfer position data of the transfer arm TUa based on the third amount of deviation. In addition, in the position adjustment of the focus ring FR, the focus ring FR may not be returned to the storage location. For example, the focus ring may be supported by the transfer arm TUa, and the transfer position of the focus ring FR may be adjusted by moving the transfer arm TUa by the third amount of deviation.

As described above, when the position of the focus ring FR is adjusted in step ST9, the transfer position is subsequently confirmed. In other words, by executing the above-described steps ST3 to ST8 again, it is confirmed whether or not the third amount of deviation in the focus ring FR of which the transfer position has been adjusted exceeds a predetermined threshold value. In a case where it is confirmed that the focus ring FR has been transferred correctly, the method MT ends. Meanwhile, in a case where it is determined that the amount of deviation is larger than the threshold value, the process proceeds to step ST9 again.

As described above, in the transfer method of one exemplary embodiment, after the focus ring FR is transferred onto the second plate 18b, the measuring instrument 100 is transferred to the inner region FRI of the focus ring FR. The measuring instrument 100 acquires the plurality of measurement values (measurement value group) for obtaining the first amount of deviation and the second amount of deviation. In the method, the third amount of deviation which is an amount of deviation of the central position of the focus ring FR with respect to the central position of the electrostatic chuck ESC is obtained from the first amount of deviation and the second amount of deviation which are obtained based on the measurement value group. In addition, the transfer position of the focus ring FR is adjusted such that the central position of the electrostatic chuck ESC and the central position of the focus ring FR coincide with each other based on the third amount of deviation. In this manner, after the focus ring FR is transferred onto the second plate 18b, the focus ring FR can be transferred with high accuracy by adjusting the transfer position of the focus ring FR based on the third amount of deviation.

In one exemplary embodiment, the transfer unit TU2 may be disposed in the transfer module TF which is a space airtightly connected to the chamber body 12. In this configuration, a focus ring FR can be transferred in the space airtightly connected to the chamber body 12. In this case, the focus ring FR can be transferred and the position of the focus ring FR can be adjusted without opening the chamber body 12 to the atmosphere.

In one exemplary embodiment, step ST8 of determining whether or not the third amount of deviation exceeds the threshold value is provided. In this case, when the third amount of deviation exceeds the threshold value, in step ST9 of adjusting the transfer position of the focus ring FR, the position of the focus ring FR may be adjusted. By providing the threshold value for the third amount of deviation, unnecessary position adjustment can be omitted.

In one exemplary embodiment, it is confirmed whether or not the third amount of deviation exceeds the threshold value in the focus ring FR of which the transfer position has been adjusted after step ST9 of adjusting the transfer position of the focus ring FR. Accordingly, the accuracy of transfer of the focus ring FR can further be improved.

Although various exemplary embodiments have been described above, various omissions, substitutions, and changes may be made without being limited to the above-described exemplary embodiments. In addition, other embodiments can be formed by combining elements in different embodiments.

For example, the number of first sensors and second sensors mounted on the measuring instrument is not limited to the above-described embodiments. The number of first sensors and second sensors may be any number of three or more. Further, in a case where it is desired to acquire only the amount of deviation in the uniaxial direction, the number of sensors may be two.

Further, although an example in which one of the process modules is used as a storage location for the focus ring FR has been described, the present disclosure is not limited thereto. For example, one of the containers (FOUP) for accommodating the workpiece W may be used as a storage location for the focus ring FR.

In addition, although the aspect in which the position adjustment of the focus ring is performed in the process module has been illustrated, the method of position adjustment is not limited thereto. For example, a module for position adjustment may be provided at a location adjacent to the transfer module. The module for position adjustment has a placing table for placing the focus ring and the measuring instrument. In one example, after the focus ring is transferred onto the placing table of the module, the measuring instrument is transferred into the inner region of the focus ring placed on the placing table. The transfer position data of the measuring instrument is adjusted in advance such that the measuring instrument can be transferred to the center of the electrostatic chuck of the process module. Subsequently, the mutual positional relationship between the focus ring and the measuring instrument is acquired, and the measuring instrument and the focus ring are transferred out from the module for position adjustment. Subsequently, based on the acquired positional relationship, the position where the focus ring is transferred into the target process module is adjusted, and the focus ring is transferred to the process module. In addition, when the focus ring is transferred out from the module for position adjustment, the focus ring receiving position by the transfer arm may be adjusted based on the acquired positional relationship. In this case, since the central position of the focus ring on the transfer arm is adjusted, the focus ring may be transferred to the target process module in that state. In this manner, the transfer position of the focus ring in the process module may be adjusted by grasping the mutual positional relationship between the focus ring and the measuring instrument at a location other than the process module. Accordingly, the focus ring can be transferred to a ti desired position in the target process module.

In addition, an example in which the first amount of deviation which is an amount of deviation of the central axis of the measuring instrument from the central axis of the focus ring, and the second amount of deviation that is an amount of deviation of the central axis of the measuring instrument from the central axis of the electrostatic chuck are obtained, has been described, but the present disclosure is not limited thereto. The first amount of deviation may be an amount of deviation of the central position of the focus ring from the central axis of the measuring instrument 100. Further, the second amount of deviation may be an amount of deviation of the central axis of the electrostatic chuck from the central axis of the measuring instrument.

From the description above, various embodiments of the present disclosure have been described in the present specification for purposes of description, and it is possible to understand that various modifications can be made without departing from the scope and spirit of the present disclosure. Therefore, the various embodiments disclosed in the present specification are not intended to be limiting, with the true scope and spirit being indicated by the appended claims.

What is claimed is:
1. A transfer method in a transfer system of a focus ring, wherein the transfer system includes a processing system and a measuring instrument,
wherein the processing system includes
a processing apparatus including a chamber body and a stage that is provided in a chamber provided by the chamber body and includes an electrostatic chuck, and
a transfer unit configured to transfer a workpiece into an inner region surrounded by the focus ring disposed on the stage and onto the electrostatic chuck based on transfer position data, and
wherein the measuring instrument includes a sensor that acquires a measurement value group for obtaining a first amount of deviation which is an amount of deviation of a central position of the measuring instrument with respect to a central position of the focus ring and a second amount of deviation which is an amount of deviation of the central position of the measuring instrument with respect to a central position of the electrostatic chuck, in a state where the measuring instrument is positioned in the inner region and on the electrostatic chuck,
the method comprising:
transferring the focus ring onto the stage by the transfer unit;
transferring the measuring instrument by the transfer unit into the inner region of the transferred focus ring and onto the electrostatic chuck;
acquiring the measurement value group by the transferred measuring instrument;
obtaining the first amount of deviation and the second amount of deviation based on the measurement value group;

obtaining a third amount of deviation which is an amount of deviation of the central position of the focus ring with respect to the central position of the electrostatic chuck based on the first amount of deviation and the second amount of deviation; and adjusting a transfer position of the focus ring by the transfer unit such that the central position of the electrostatic chuck and the central position of the focus ring coincide with each other based on the third amount of deviation.

2. The transfer method according to claim 1, wherein the transfer unit is disposed in a space air-tightly connected to the chamber body.

3. The transfer method according to claim 1, further comprising:

determining whether the third amount of deviation exceeds a threshold value, wherein, in said adjusting the transfer position of the focus ring, the transfer position of the focus ring is adjusted in a case where it is determined that the third amount of deviation exceeds the threshold value.

4. The transfer method according to claim 2, further comprising:

determining whether the third amount of deviation exceeds a threshold value, wherein, in said adjusting the transfer position of the focus ring, the transfer position of the focus ring is adjusted in a case where it is determined that the third amount of deviation exceeds the threshold value.

5. The transfer method according to claim 3, further comprising:

confirming whether the third amount of deviation exceeds the threshold value in the focus ring of which the transfer position has been adjusted after said adjusting the transfer position of the focus ring.

6. The transfer method according to claim 4, further comprising:

confirming whether the third amount of deviation exceeds the threshold value in the focus ring of which the transfer position has been adjusted after said adjusting the transfer position of the focus ring.

7. A transfer system of a focus ring, wherein the transfer system includes a processing system and a measuring instrument, wherein the processing system includes a processing apparatus including a chamber body and a stage that is provided in a chamber provided by the chamber body and includes an electrostatic chuck, and a transfer unit configured to transfer the focus ring onto the stage, and to transfer the measuring instrument into an inner region surrounded by the focus ring and onto the electrostatic chuck, wherein the measuring instrument is configured to obtain a third amount of deviation which is an amount of deviation of a central position of the focus ring with respect to a central position of the electrostatic chuck based on a first amount of deviation which is an amount of deviation of a central position of the measuring instrument with respect to the central position of the focus ring and a second amount of deviation which is an amount of deviation of the central position of the measuring instrument with respect to a central position of the electrostatic chuck, in a state where the measuring instrument is positioned in the inner region and on the electrostatic chuck, and wherein the transfer unit is configured to adjust a transfer position of the focus ring such that the central position of the electrostatic chuck and the central position of the focus ring coincide with each other based on the third amount of deviation.

\* \* \* \* \*